(12) United States Patent
Natarajan et al.

(10) Patent No.: US 8,507,153 B2
(45) Date of Patent: *Aug. 13, 2013

(54) COMPOSITIONS, OPTICAL DATA STORAGE MEDIA AND METHODS FOR USING THE OPTICAL DATA STORAGE MEDIA

(75) Inventors: Arunkumar Natarajan, Schenectady, NY (US); Kwok Pong Chan, Troy, NY (US); Riffard Pierre Jean-Gilles, Schenectady, NY (US); Robert James Perry, Niskayuna, NY (US); Victor Petrovich Ostroverkhov, Ballston Lake, NY (US); Evgenia Mikhailovna Kim, Ballston Lake, NY (US); Julia Lam Lee, Niskayuna, NY (US); Eugene Pauling Boden, Scotia, NY (US); Patrick Joseph McCloskey, Watervliet, NY (US); Brian Lee Lawrence, Waunakee, WI (US)

(73) Assignee: General Electric Company, Niskayuna, NY (US)

( * ) Notice: Subject to any disclaimer, the term of this patent is extended or adjusted under 35 U.S.C. 154(b) by 467 days.

This patent is subject to a terminal disclaimer.

(21) Appl. No.: 12/551,455

(22) Filed: Aug. 31, 2009

(65) Prior Publication Data
US 2011/0053055 A1    Mar. 3, 2011

(51) Int. Cl.
*G03H 1/02* (2006.01)
(52) U.S. Cl.
USPC ............................. 430/1; 430/2; 359/3
(58) Field of Classification Search
None
See application file for complete search history.

(56) References Cited

U.S. PATENT DOCUMENTS

| | | | |
|---|---|---|---|
| 4,371,602 A * | 2/1983 | Iwasaki et al. | 430/175 |
| 4,743,527 A * | 5/1988 | Yoshida et al. | 430/272.1 |
| 6,322,931 B1 | 11/2001 | Cumpston et al. | |
| 6,402,037 B1 | 6/2002 | Prasad et al. | |
| 6,432,610 B1 | 8/2002 | Rentzepis et al. | |
| 6,551,682 B1 | 4/2003 | Tosaki et al. | |
| 6,947,311 B2 | 9/2005 | Berner et al. | |
| 6,969,578 B2 | 11/2005 | Robello et al. | |
| 6,969,764 B2 | 11/2005 | Ogiso et al. | |
| 7,022,392 B2 | 4/2006 | Dinnocenzo et al. | |

(Continued)

FOREIGN PATENT DOCUMENTS

| | | | |
|---|---|---|---|
| EP | 1964892 | | 9/2008 |
| GB | 2290489 | * | 1/1996 |

(Continued)

OTHER PUBLICATIONS

Del Ray et al., "Synthesis and non-linear optical, photophysical and electrochemical properties of subphthalocyanines", JACS 120(49) pp. 12808-12817 (1998).*

(Continued)

*Primary Examiner* — Martin Angebranndt
(74) *Attorney, Agent, or Firm* — Andrew J. Caruso

(57) ABSTRACT

There are provided compositions, optical data storage media and methods of using the optical data storage media. The compositions comprise a non-linear sensitizer comprising one or more subphthalocyanine reverse saturable absorbers capable of absorbing actinic radiation to cause upper triplet energy transfer to a reactant that undergoes a photochemical change upon triplet excitation.

11 Claims, 17 Drawing Sheets

(56) References Cited

U.S. PATENT DOCUMENTS

| | | | |
|---|---|---|---|
| 7,388,695 B2 | 6/2008 | Lawrence et al. | |
| 7,452,847 B2 | 11/2008 | Kuboyama et al. | |
| 7,459,263 B2 | 12/2008 | Farid et al. | |
| 2002/0168513 A1* | 11/2002 | Hattori et al. | 428/336 |
| 2003/0091925 A1* | 5/2003 | Baumann et al. | 430/166 |
| 2005/0136357 A1 | 6/2005 | Farid et al. | |
| 2008/0096999 A1* | 4/2008 | Hirata et al. | 522/75 |
| 2008/0144145 A1 | 6/2008 | Boden et al. | |
| 2008/0144146 A1* | 6/2008 | Boden et al. | 359/3 |
| 2008/0247011 A1 | 10/2008 | Lawrence et al. | |
| 2010/0302927 A1* | 12/2010 | Natarajan et al. | 369/103 |
| 2011/0051586 A1* | 3/2011 | Natarajan et al. | 369/103 |
| 2011/0053054 A1* | 3/2011 | Natarajan et al. | 430/2 |
| 2011/0081602 A1* | 4/2011 | Natarajan et al. | 430/2 |
| 2012/0052232 A1* | 3/2012 | Natarajan et al. | 428/64.4 |

FOREIGN PATENT DOCUMENTS

| | | |
|---|---|---|
| JP | 10330633 A | 12/1998 |
| WO | 9821521 | 5/1998 |
| WO | WO2006101873 A2 | 9/2006 |

OTHER PUBLICATIONS

Dini et al., "Nonlinear Optical Effects Related to Saturable and Reverse Absorption by Subphthalocyanines at 532 nm," Chem. Commun., 2005, pp. 3796-3798.

Rogers et al., "Photophysical Characterization of a Series of Platinum(II)-Containing Phenyl-Ethynyl Oligomers", J Phys Chem. A., 2002, pp. 10108-10115, vol. 106.

European Search Report dated Dec. 2, 2010 and Written Opinion.

\* cited by examiner

2

COMPOSITIONS, OPTICAL DATA STORAGE MEDIA AND METHODS FOR USING THE OPTICAL DATA STORAGE MEDIA

BACKGROUND

The present disclosure relates to compositions and optical data storage media as well as methods of using the optical data storage media.

Generally, speaking, reverse saturable absorber (RSA) are compounds that have extremely low linear absorption at a given wavelength, and transmit nearly all of the light at this wavelength. However, when subjected to high intensity laser power at these given wavelengths, low level linear absorption can lead to a state where the molecule has a higher absorption cross section and becomes highly absorbing at that same wavelength; causing it to strongly absorb subsequent photons. For example, many RSAs experience photoexcitation when impinged upon by incident actinic radiation having a wavelength of 532 nm. Because this wavelength is within the green color portion of the visible spectrum, these RSA's may typically be referred to as "green" RSA's.

Recently, certain RSA's have found utility in the area of data storage systems. Optical data storage, wherein reading or writing of data is accomplished by shining light on, e.g., a disk, provides advantages over data recorded in media which must be read by other means, e.g., a magnetically sensitive head for reading magnetic media, or a needle for reading media recorded in vinyl. And, more data can be stored in smaller media optically than can be stored in vinyl media. Further, since contact is not required to read the data, optical media are not as vulnerable to deterioration over periods of repeated use as vinyl media.

Optical data storage media also offer multiple advantages when compared to magnetic storage media. For example, unlike the magnetic disk drives, optical data storage media are most commonly provided as removable media, readily suitable for archiving and backing up data, sharing of content between unconnected systems, and distribution of prerecorded content. Although removable magnetic media, e.g., magnetic tapes, are available, the life-time of information stored on such media is typically limited to 10-12 years, the media are generally rather expensive, and data access is slow. In contrast, optical data storage media can provide the flexibility of removable recordable and/or prerecorded medium, fast data access time, robust inexpensive manufacturing of the media and drives that are affordable enough for consumer computer and entertainment systems.

Nonetheless, conventional optical data storage media does have limitations. First, the storage density of optical media is limited by physical constraints on the minimum size of a recording bit. Another limitation of optical storage is that data is usually stored in one or two discrete layers, either on the surface or sandwiched within the media. Recording the information depth-wise can increase storage capacity, however, methods of doing so, i.e., bleaching and photoreactions, require a large amount of optical power to produce readable marks. As a result, the rate of recording using these conventional 3D recording methods is slow. Further, the media used in these methods typically exhibits a linear response to light energy, and as a result, may require some mechanism to eliminate the sensitivity of the medium to light after the data have been recorded to eliminate unintended erasure, data loss, etc.

Holographic storage is optical data storage in which the data is represented as holograms, which are images of three dimensional interference patterns created by the intersection of two beams of light in a photosensitive medium. More particularly, the superposition of a reference beam and a signal beam, containing digitally encoded data, forms a 3-D interference pattern within the volume of the medium resulting in a chemical reaction that changes or modulates the refractive index of the photosensitive medium. This modulation records both the intensity and phase information from the signal as the hologram. The hologram can later be retrieved by exposing the storage medium to the reference beam alone, which interacts with the stored holographic data to generate a reconstructed signal beam proportional to the initial signal beam used to store the holographic image.

Early attempts at holographic storage relied on a page-based approach, i.e., where the bits of digital information are encoded into volume holograms as two-dimensional arrays of logical zeros and ones that traversed a 'slice' of the necessarily linear media onto which the holograms were recorded. Because a relatively large volume of the media was utilized, the recording and read-out equipment required to utilize a page-based approach can be complex and expensive, and reading or writing within the media is very sensitive to fluctuations in temperature and vibrations, as well as small variations in writing or reading wavelength or intensity.

As a result of these shortcomings, more recent research into holographic data storage has focused on a bit-wise approach, where each bit (or few bits) of information is represented by a hologram localized to a microscopic volume within a medium to create a region that reflects the readout light. Such localized volume holographic micro-reflectors may be arranged into multiple data layers throughout the volume of the medium. In such an arrangement, the readout and recording of data in the layers inevitably leads to exposure of the adjacent layers to the recording/readout radiation, and so, although linear materials have been shown to work for holographic data storage in single bit application, having a media that can support many layers of data without affecting other layers of data during the writing and reading steps would be more advantageous.

Materials capable of accommodating a bit-wise data storage approach are highly sought after as the equipment utilized to read and write to such material is either currently commercially available, or readily provided with modifications to readily commercially available reading and writing equipment. Further, holographic data storage by the bit-wise approach is more robust to temperature, wavelength, intensity variations, and vibration than holographic data stored using the page-based approach. In order to be optimally useful in the recordation of holograms, and in particular, micro-holograms, bit-wise data storage materials must be non-linear and further, will desirably exhibit refractive index change ($\Delta n$) of at least about 0.005 to about 0.05 in response to recording light. Ultimately, the magnitude of the refractive index modulations produced in the material by the recording light will define the diffraction efficiency for a given system configuration, which translates to the signal to noise ratio, bit error rate, and the achievable data density.

Thus, there remains a need for optical data storage media that can exhibit a nonlinear (or "threshold") response to the recording light intensity and that is suitable for bit-wise holographic data storage. In particular, it would be advantageous for holograms stored in the media to be limited in depth so that increased capacity could be realized. It would be further desirable for such data storage media to be written in such a way that refractive index of the surrounding media is not significantly altered and that a substantial degradation of hologram efficiency at various depths is not seen.

BRIEF DESCRIPTION

A composition is provided, comprising a reactant capable of undergoing a change upon triplet excitation ($T_n$; n>1) and a non-linear sensitizer comprising one or more subphthalocyanine (sub-PC) reverse saturable absorbers (RSAs) capable of absorbing actinic radiation at about 405 nm to cause upper triplet-to-triplet energy transfer to said reactant.

An optical data storage medium is provided. The medium comprises a polymer matrix, a reactant capable of undergoing a change upon triplet excitation ($T_n$; n>1) and a non-linear sensitizer comprising one or more subphthalocyanine (sub-PC) reverse saturable absorbers (RSAs) capable of absorbing actinic radiation at about 405 nm to cause upper triplet-to-triplet energy transfer to said reactant.

Also provided are methods for optical data storage. The methods comprise providing an optical data storage medium comprising a sensitizer and a reactant. The reactant is capable of undergoing a change upon triplet excitation and the non-linear sensitizer comprises one or more subphthalocyanine (sub-PC) reverse saturable absorbers (RSAs) and is capable of absorbing actinic radiation to cause upper triplet-to-triplet energy transfer to said reactant.

DRAWINGS

These and other features, aspects, and advantages of the present invention will become better understood when the following detailed description is read with reference to the accompanying drawings in which like characters represent like parts throughout the drawings, wherein.

DETAILED DESCRIPTION

Figure 1A:
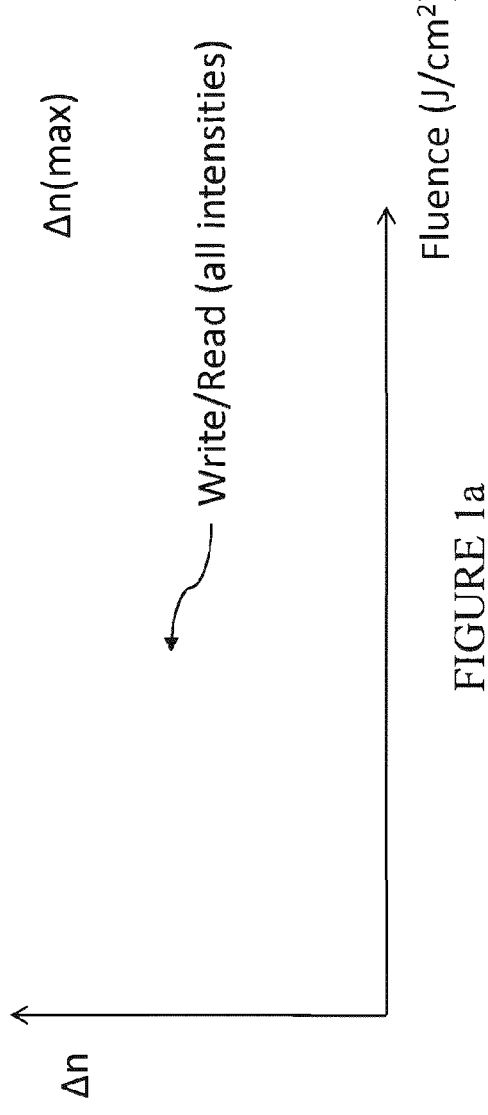
FIG. 1A is a graphical depiction of the response of a linear sensitizer to actinic radiation.

Unless defined otherwise, technical and scientific terms used herein have the same meaning as is commonly understood by one of skill in the art to which this invention belongs. The terms "first", "second", and the like, as used herein do not denote any order, quantity, or importance, but rather are used to distinguish one element from another. Also, the terms "a" and "an" do not denote a limitation of quantity, but rather denote the presence of at least one of the referenced item, and the terms "front", "back", "bottom", and/or "top", unless otherwise noted, are merely used for convenience of description, and are not limited to any one position or spatial orientation. If ranges are disclosed, the endpoints of all ranges directed to the same component or property are inclusive and independently combinable (e.g., ranges of "up to about 25 wt. %, or, more specifically, about 5 wt. % to about 20 wt. %," is inclusive of the endpoints and all intermediate values of the ranges of "about 5 wt. % to about 25 wt. %," etc.). The modifier "about" used in connection with a quantity is inclusive of the stated value and has the meaning dictated by the context (e.g., includes the degree of error associated with measurement of the particular quantity).

As used herein, "diffraction efficiency" means a fraction of the beam power reflected by a hologram as measured at the hologram location with respect to the incident probe beam power, while "quantum efficiency" means a probability of an absorbed photon to result in a chemical change that produces a refractive index change. "Fluence" means the amount of optical beam energy that has traversed a unit area of the beam cross-section (measured, for example, in Joule/cm$^2$), while "intensity" means optical radiative flux density, e.g. amount of energy traversing a unit area of beam cross-section in unit time (measured in, for example, Watt/cm$^2$).

There is provided herein a composition comprising a reactant and a non-linear sensitizer. More particularly, the composition comprises a reactant capable of undergoing a change upon triplet excitation ($T_n$; n>1) and a non-linear sensitizer comprising one or more subphthalocyanine (sub-PC) reverse saturable absorbers (RSAs). The non-linear sensitizers are capable of absorbing incident actinic radiation, e.g., in the form of one or more photons, and then transferring the energy to the reactant molecule to induce a molecular rearrangement of the reactant into a product. The nonlinear sensitizers used in the present optical data storage media are capable of transferring energy from an upper triplet state ($T_n$, wherein n>1), which has a very short lifetime (nanoseconds to a few μ (micro) seconds), to the reactant.

In some embodiments, the present nonlinear sensitizers may absorb two photons, typically, sequentially. Also, once the sensitizers described herein transfer the absorbed energy to the reactant, they return to their original state, and may repeat the process many times over. The sensitizers thus do not get substantially consumed over time, although their ability to absorb energy and release it to one or more reactants may degrade over time. This is in contrast to materials known conventionally as photosensitive materials, which can absorb energy (typically a single photon) and not transfer it to other molecules, but undergo conversion to a new structure, or react with another molecule to form a new compound in so doing.

Figure 5:
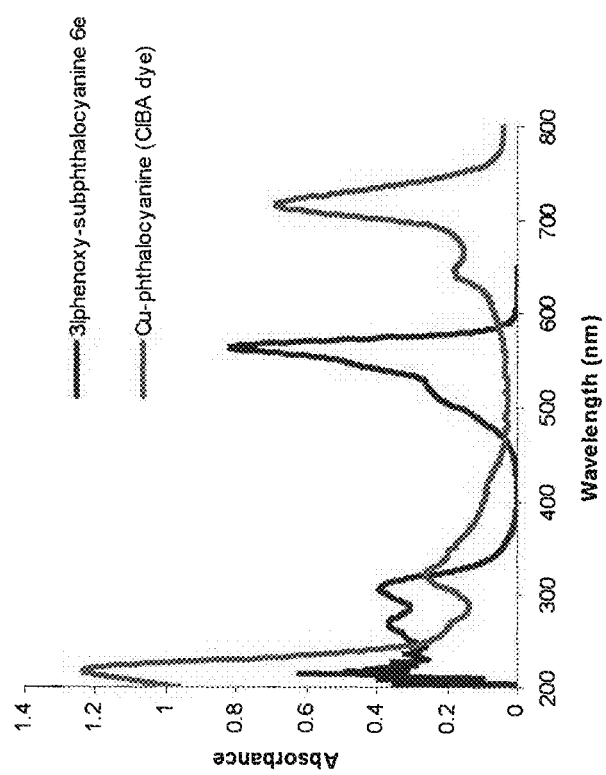
FIG. 5 is the UV-Vis spectra of a conventional phthalocyanine RSA and a subphthalocyanine RSA according to another embodiment.

In one embodiment, the non-linear sensitizers comprise subphthalocyanines which exhibit reverse saturable absorption (RSAs). More particularly, and although many RSAs are known, including phthalocyanines, and have been used in nonlinear applications, conventional phthalocyanine RSA's typically exhibit absorption spectra and nonlinear optical responses more suited to use with "green" lasers, i.e., lasers utilizing radiation with a wavelength of about 532 nm. In contrast, the present subphthalocyanine RSAs can show superior RSA behavior with 'blue' lasers, i.e., lasers utilizing radiation with a wavelength of about 405 nm due to the substantial transparency of absorption at 405 nm when compared to 532 nm. The UV-Vis spectra for a conventional "green" phthalocyanine RSA and a "blue" subphthalocyanine RSA according to one embodiment of the invention are shown in FIG. 5. As shown, there is a substantial blue shift in the $\lambda_{max}$ as well as the region in the "blue" subphthalocyanine RSA (eg. 3-iodophenoxysubphthalocyaninato]boron(III)) versus the conventional "green" phthalocyanine RSA (eg. Cu-phthalocyanine).

Figure 4:
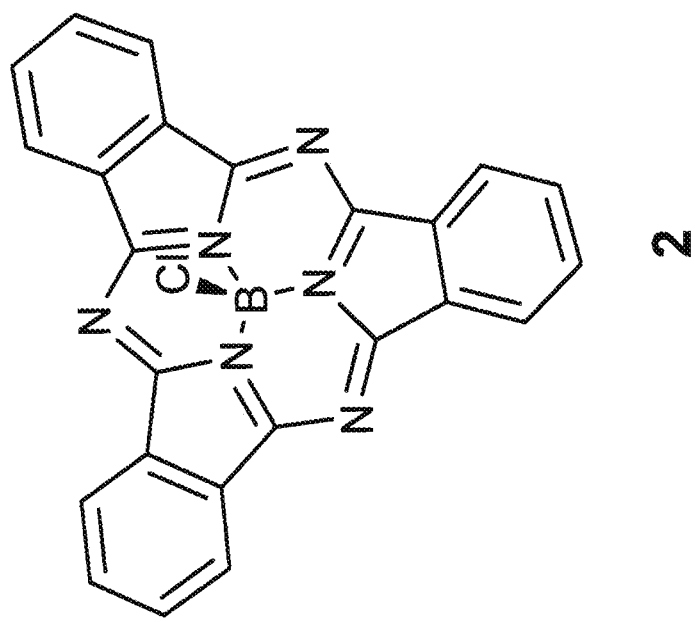
FIG. 4 is drawing of the chemical structure of a subphthalocyanine RSA according to one embodiment.

Desirably, the subphthalocyanine RSAs will be capable of entering into the upper triplet ($T_2$) state upon photoexcitation of the subphthalocyanine RSA with incident actinic radiation at a wavelength of about 405 nm and transferring energy from this upper excited triplet state (Tn) to adjacent reactants. Subphthalocyanines are 14-π-electron aromatic molecules that possess a cone-like structure with a boron atom as the central metal, and an axial ligand, such as the sub-Pc shown in FIG. 4. Examples of suitable subphthalocyanines include, but are not limited to, chloro[2,9,16-tribromosubphthalocyanato] boron(III), chloro[2,9,16-triiodosubphthalocyanato]boron (III), chloro[trinitrosubphthalocyanato]boron(III), chloro[2, 9,16-tri-tert-butyl- and chloro[2,9,17-tri-tert-butylsubphthalocyanato]boron(III), phenoxy [subphthalocynato]boron(III), 3-bromophenoxy [subphthalocyanato]boron(III), 4-bromophenoxy [subphthalocyninato]boron(III), 3,5-dibromophenoxysubphthalocyaninato]boron(III), 3-iodophenoxysubphthalocyaninato]boron(III), 4-iodophenoxy[subphthalocyninato]boron(III), phenoxy[2,9,16-triiodosubphthalocyaninato]boron(III), 3-iodophenoxy[2,9,16-triiodosubphthalocyaninato]boron(III), and 4-iodophenoxy [2,9,16-triiodosubphthalocyaninato]boron(III). Any of these, as well as any other subphthalocyanine RSA substantially to radiation at a wavelength of about 405 nm may be utilized in the optical data storage media and methods described.

The amount of nonlinear sensitizer used in the composition can depend on its optical density at the wavelength of incident actinic radiation. Solubility of the sensitizer may also be a factor. Generally speaking, the sensitizer may be used in amounts of from about 0.002 weight % to about 5 weight % based upon the total weight of the composition.

Figure 3:
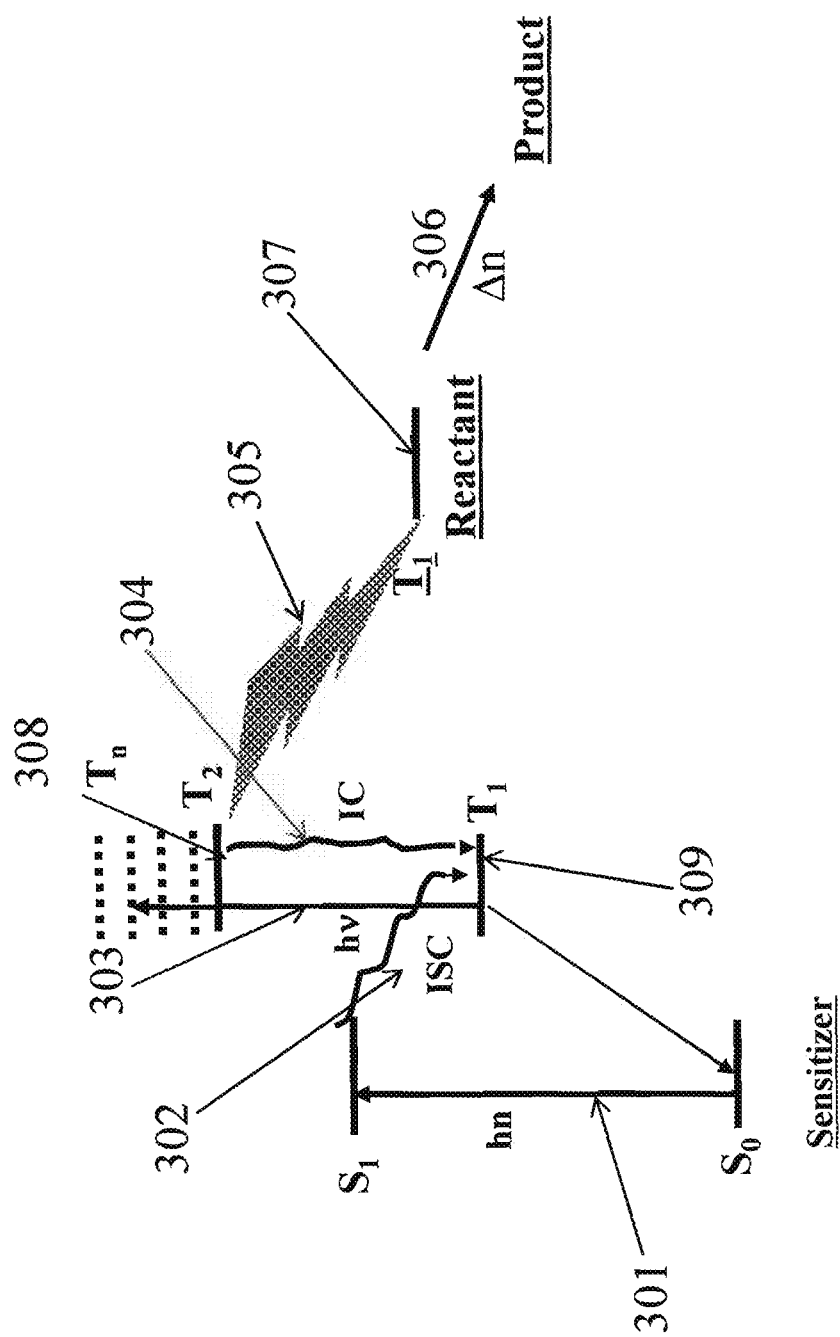
FIG. 3 is a schematic energy level diagram showing the upper triplet $T_n$ excited state absorption and resulting energy transfer for a sensitizer exhibiting reverse saturable absorption.

The reactant(s) utilized in the present composition are capable of undergoing a change upon triplet excitation. Referring to FIG. 3, the reactants used in the present optical data storage media have a triplet energy denoted by arrow 307 below that of the $T_2$ state of the sensitizer denoted by arrow 308, but above that of the $T_1$ state of the sensitizer, shown at arrow 309. The reactants are also capable of receiving energy from an upper triplet state ($T_2$ or higher) of the sensitizer, and undergoing a change to form a product.

As used herein, the term "change" is meant to include any indirect photochemical reaction of the reactant, e.g., photodimerization or isomerization. Photodimerization is a bimolecular photochemical process involving an electronically excited unsaturated molecule that undergoes addition with an unexcited molecule of a structurally similar and/or identical species (e.g. two olefins combining to form a cyclobutane ring structure). The covalent bonding that occurs in this reaction produces a new moiety, which can be generally classified as a photoproduct. When the word "indirect" is used in conjunction with terms such as photodimerization or photochemical reaction or photoreaction, it means that the reactant did not receive the energy directly from absorption of a photon, but rather from another molecule (such as, e.g., a sensitizer or mediator) that first absorbed the photon and then transferred a portion of that energy to the reactant that subsequently underwent dimerization.

Examples of reactants suitable for use in some embodiments of the composition described include, but are not limited to, (i) those that can undergo dimerization so that less volume change is required to go from reactant to product, e.g., reactants that undergo dimerization processes not by direct photoexcitation of the reactant but by indirect "non-radiative energy transfer" (in the present case triplet-to-triplet energy transfer) pathway from the photoexcited sensitizer to the reactant; (ii) those for which a nonlinear sensitizer receives energy from a two-photon process and delivers that energy to one reactant that subsequently condenses with a second reactant to provide a product; (iii) those that, when derivatized on a polymer backbone can provide a very large refractive index change, which corresponds to the available capacity of the material, e.g., a $\Delta n_{max}$ of at least about 0.08 can be achieved if >85% of the reactants are converted to product; and (iv) those that, when derivatized on a polymer backbone, are capable of undergoing both inter- and intramolecular condensation reactions, thereby accelerating the consumption thereof, and providing desired refractive index (Δn) changes with incident fluence of less than 10 J/cm² as a result of higher quantum efficiency of the sensitized photo-reaction, which in turn may also provide greater diffraction efficiencies and shorter recording times within, e.g., a data storage medium incorporating the composition.

As those of ordinary skill in the art understand, the fundamental requirement for holographic data storage is being able to create a refractive index change (dn) of the individual fringes within the hologram, compared to the surrounding material, on the order of 0.005 to 0.05. However, measuring the refractive index of individual fringes is not possible. Refractive index (RI) measurements can be done on bulk materials using spin coated samples in combination with an instrument knows as an ellipsometer. Thus, the reactive materials used in these applications have first been tested to determine the net available dn the material is capable of by measuring the RI of the unreacted sample and then converting over 85% of the material to the reacted form and remeasuring the RI to determine the dn. The important feature for the hologram in holographic data storage is having a sufficient amount of light reflected back (diffracted) to the detector to represent a bit of information. This can be determined by measuring the diffraction efficiency of the material. Experimentally, it is easiest to use relatively low numerical aperture (NA) lenses and write relatively large holograms to record relatively large diffraction efficiencies. For example, based on the predictions of the coupled wave theory, for a given magnitude of the refractive index modulation, the DE is approximately proportional to the square of the hologram depth. The hologram depth is approximately inversely proportional to NA^2, which makes overall dependence of DE ~ 1/NA^4. Thus, the D.E. is a function, among other things, of the response of the reactive material, the NA of the lens used, and the fluence used to record the hologram. Since those parameters are often different for experimentalist working on holographic data storage, it is generally recognized that correlating those measurements back to an approximate dn is the preferred method of comparing materials/systems.

Any reactant(s) having a triplet energy state between the $T_1$ and $T_2$ states of the sensitizer can be utilized, and, selection of an appropriate reactant can thus depend upon the selection of the desired sensitizer. Suitable reactants include, but are not limited to, stilbenes. Specific examples of stilbenes expected to be useful in the optical storage media disclosed herein include, but are not limited to trans-stilbene, meta- (or) para halogen (F, Cl, Br, or I) substituted stilbene, meta- (or) para trans-methylstilbene, trans-[meta- (or) para] nitrostilbene, trans-[meta- (or) para] cyanostilbene, trans-[meta- (or) para]-methoxystilbene, trans-[3,3'] or [4,4'], or [2,4] or [3,4] dimethoxy, difluoro, dibromo, dichloro, diiodo, substituted trans-stilbenes, trans-2,4,6-trimethylstilbene, trans-2,2',4,4', 6,6'-hexamethylstilbene, or combinations of these.

Even more specifically, suitable reactants include (E)-1-methoxy-4-styrylbenzene, (E)-1-fluoro-4-styrylbenzene, (E)-1-chloro-4-styrylbenzene, (E)-1-bromo-4-styrylbenzene, (E)-1-iodo-4-styrylbenzene, (E)-1-methoxy-3-styrylbenzene, (E)-1-fluoro-3-styrylbenzene, (E)-1-chloro-3-styrylbenzene, (E)-1-bromo-3-styrylbenzene, (E)-1-iodo-3-styrylbenzene, (E)-1-cyano-4-styrylbenzene, or combinations thereof.

Yet other suitable reactants include (E)-1,2-bis(4-methoxyphenyl)ethene, (E)-1,2-bis(4-fluorophenyl)ethene, (E)-1,2-bis(4-chlorophenyl)ethene, (E)-1,2-bis(4-bromophenyl)ethene, (E)-1,2-bis(4-iodophenyl)ethene, (E)-1,2-bis(3-methoxyphenyl)ethene, (E)-1,2-bis(3-fluorophenyl)ethene, (E)-1,2-bis(3-chlorophenyl)ethene, (E)-1,2-bis(3-bromophenyl)ethene, (E)-1,2-bis(3-iodophenyl)ethene, or combinations of these.

Still other suitable reactants include (E)-1-methoxy-2-(4-methoxystyryl)benzene, (E)-1-fluoro-2-(4-fluorostyryl)benzene, (E)-1-chloro-2-(4-chlorostyryl)benzene, (E)-1-bromo-2-(4-bromostyryl)benzene, (E)-1-iodo-2-(4-iodostyryl)benzene, (E)-1-iodo-2-(4-cyanostyryl)benzene, (E)-1-methoxy-3-(4-methoxystyryl)benzene, (E)-1-fluoro-3-(4-fluorostyryl)benzene, (E)-1-chloro-3-(4-chlorostyryl)benzene, (E)-1-bromo-3-(4-bromostyryl)benzene, (E)-1-iodo-3-(4-iodostyryl)benzene, (E)-1-iodo-3-(4-cyanostyryl)benzene, (E)-1-methoxy-2-(3-methoxystyryl)benzene, (E)-1-fluoro-2-(3-fluorostyryl)benzene, (E)-1-chloro-2-(3-chlorostyryl)benzene, (E)-1-bromo-2-(3-bromostyryl)benzene, (E)-1-iodo-2-(3-iodostyryl)benzene, (E)-1-iodo-2-(3-cyanostyryl)benzene, or combinations thereof.

In other embodiments, the reactant(s) may comprise one or more cinnamate materials, and cinnamate derivatives, such as those recently discovered and disclosed in U.S. patent application Ser. No. 12/550,521, entitled "Optical Data Storage Media and Methods of Using the Same", filed concurrently herewith and incorporated herein by reference in its entirety for any and all purposes, so long as not directly contradictory with the teachings herein. In some embodiments, cinnamate materials that are capable of undergoing [2+2] indirect photodimerization and indirect photopolymerization may be used, due to their transparency (negligible UV absorption) at 405 nm in order to keep the linear bleaching of the cinnamate to a minimum and facilitate only the triplet-triplet energy transfer from the excited sensitizer. In some embodiments, the cinnamate materials will desirably comprise polyvinylcinnamates (PVCm) with cinnamate content of the polyvinyl backbone varying between about 54 wt % to about 75 wt % based upon the total weight of the polyvinylcinnamate.

Examples of polyvinylcinnamates and cinnamamide analogs include, but are not limited to polyvinylcinnamate (PVCm), polyvinyl 4-chlorocinnamate (PVClCm), polyvinyl 4-methoxycinnamate (PVMeOCm), (2E,2'E)-((1S,2S)-cyclohexane-1,2-diyl)bis(3-phenylacrylate), (2E,2'E)-(1S,2S)-cyclohexane-1,2-diyl)bis(4-chlorophenylacrylate), (2E,2'E)-(1S,2S)-cyclohexane-1,2-diyl)bis(4-methoxyphenyl) acrylate), (2E,2'E)-N,N'-((1S,2S)-cyclohexane-1,2-diyl)bis(3-phenyl)acrylamide, (2E,2'E)-N,N'-((1S,2S)-cyclohexane-1,2-diyl)bis(3-(4-chlorophenyl)acrylamide), (2E,2'E)-N,N'-((1S,2S)-cyclohexane-1,2-diaryl)bis(3-(4-methoxyphenyl) acrylamide. These are shown below:

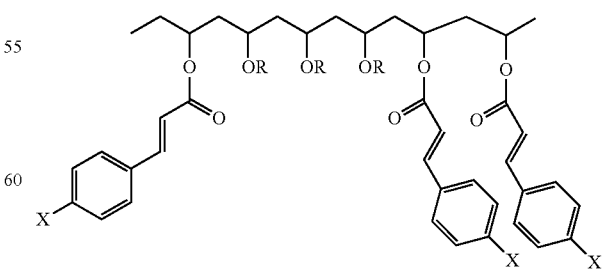

RSA3*

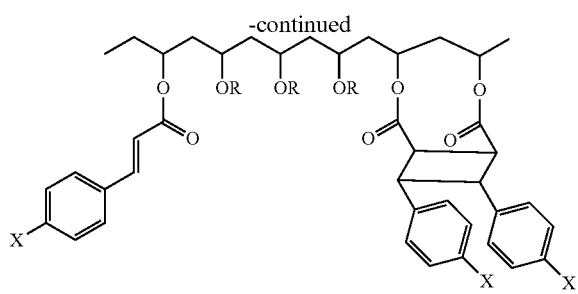

Where R=H or Cinnamate
X=H (Polyvinylcinnamate (PVCm),
OMe (Polyvinyl 4-methoxycinnamate (PVMeOCm), or
Cl (Polyvinyl 4-chlorocinnamate (PVClCm)

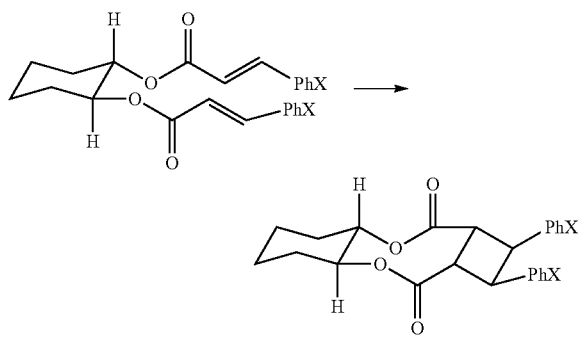

Where X=(para)-H: (2E,2'E)-((1S,2S)-cyclohexane-1,2-diyl)bis(3-phenylacrylate) or
X=(para)-Cl: (2E,2'E)-((1S,2S)-cyclohexane-1,2-diyl)bis(3-(4-chlorophenyl)acrylate) or
X=(para)-MeO: (2E,2'E)-((1S,2S)-cyclohexane-1,2-diyl)bis(3-(4-methoxyphenyl)acrylate)

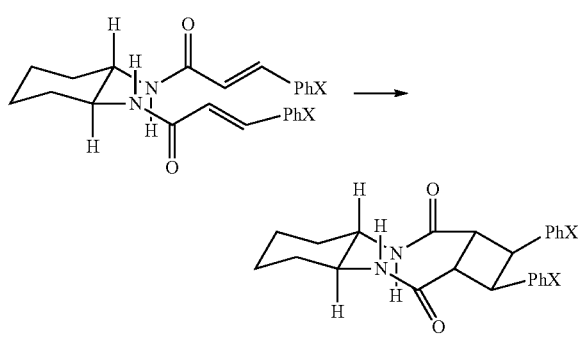

Where X=(para)-H: (2E,2'E)-N,N'-((1S,2S)-cyclohexane-1,2-diyl)bis(3-phenyl)acrylamide) or
X=(para)-Cl: (2E,2'E)-N,N'-((1S,2S)-cyclohexane-1,2-diyl)bis(3-(4-chlorophenyl)acrylamide) or
X=(para)-MeO: (2E,2'E)-N,N'-((1S,2S)-cyclohexane-1,2-diyl)bis(3-(4-methoxyphenyl)acrylamide).

The reactant is usually present in relatively high concentrations to promote more efficient triplet energy transfer. For example, the reactant may be present in the composition in amounts of from about 2 weight % to about 80 weight %, based upon the total weight of the composition.

Optionally, the composition may further comprise a mediator to assist in upper triplet energy transfer from the sensitizer to the reactant. The triplet state ($T_{1m}$) of the mediator will desirably be (a) below the triplet state ($T_n$; n>1) of the sensitizer but above the $T_1$ of the sensitizer and (b) above the triplet state ($T_{1r}$) of the reactant, or ideally between about 50 kcal/mol and 90 kcal/mol.

Examples of suitable mediators include, but are not limited to, acetophenone ($T_1 \approx 78$ kcal/mol), dimethylphthalate ($T_1 \approx 73$ kcal/mol), propiophenone ($T_1 \approx 72.8$ kcal/mol), isobutyrophenone ($T_1 \approx 71.9$ kcal/mol), cyclopropylphenylketone ($T_1 \approx 71.7$ kcal/mol), deoxybenzoin ($T_1 \approx 71.7$ kcal/mol), carbazole ($T_1 \approx 69.76$ kcal/mol), diphenyleneoxide ($T_1 \approx 69.76$ kcal/mol), dibenzothiophene ($T_1 \approx 69.5$ kcal/mol), 2-dibenzoylbenzene ($T_1 \approx 68.57$ kcal/mol), benzophenone ($T_1 \approx 68$ kcal/mol), polyvinylbenzophenone ($T_1 \approx 68$ kcal/mol), 1,4-diacetylbenzene ($T_1 \approx 67.38$ kcal/mol), 9H-fluorene ($T_1 \approx 67$ kcal/mol), triacetylbenzene ($T_1 \approx 65.7$ kcal/mol), thioxanthone ($T_1 \approx 65.2$ kcal/mol), biphenyl ($T_1 \approx 65$ kcal/mol), phenanthrene ($T_1 \approx 62$ kcal/mol), phenanthrene ($T_1 \approx 61.9$ kcal/mol), flavone ($T_1 \approx 61.9$ kcal/mol), 1-napthonirile ($T_1 \approx 57.2$ kcal/mol), poly(β-naphthoylstyrene) ($T_1 \approx 55.7$ kcal/mol), Fluorenone ($T_1 \approx 55$ kcal/mol), and combinations of these.

The amount of mediator used, if any, should not be so much as to cause self-quenching, i.e., when two triplets of the mediator meet each other to generate a singlet state and a ground state of the mediator. Optimal amounts of any mediator may also depend on the particular sensitizer. Bearing such considerations in mind, useful concentrations of the mediator can range from about 1 weight % to about 20 weight % based upon the total weight of the composition.

The compositions provided may be utilized in any application in which their properties may provide benefit. Examples of these include, but are not limited to, optical waveguides, gradient index lenses, optical data storage media and in digital holographic imaging.

Optical waveguides are used as components in integrated optical circuits and can be made in various ways. One way is to use a laser to pattern a photosensitive material creating a "core" of one refractive index material surrounded by a "cladding" material of a different refractive index that serves to guide the light. Generally, these photosensitive materials are linearly responsive; requiring the wavelength of the patterning laser and the absorption of material that undergoes refractive index change to both be at wavelengths well away from the wavelengths of light that will actually travel within the waveguide. This is necessary because if the waveguided beam is the same or nearly the same as the light traveling in the core, then it will begin to bleach the cladding material and broaden the waveguide; making it degrade and become unusable. However, with these materials, the medium will only change at the highest intensity area of the beam during patterning, and together with the threshold effect, could produce sharper contrast between the core and cladding regions. Also, light of a similar wavelength at lower intensity could travel down the core and would not degrade the cladding material. Optical waveguides could thus be improved via incorporation of the compositions described herein.

Gradient-index (GRIN) lenses could also be fashioned from the compositions described herein. A GRIN lens is a lens whose material refractive index varies continuously as a function of spatial coordinates in the medium. With the present compositions, a composition could be converted into a GRIN lens by patterning with a laser operating at high power. Alternatively, a blank lens with a composition could be modified into a GRIN lens in a similar manner. The advantages are that the lens could be used with low power light beams at various wavelengths without the danger of bleaching away the GRIN and destroying the lens.

Digital Holographic Imaging is a way to create 3D images useful for visualizing without the aid of special glasses (autostereoscopic). These are useful for producing interactive 3D displays for government and commercial uses such as cities with skyscrapers that can be viewed from various angles. Again, use of the compositions described, with threshold characteristics, allows the proper patterning without the problem of bleaching in ambient light.

There is also provided herein an optical data storage medium that, in addition to the nonlinear sensitizer, reactant, and optionally mediator, further comprises a polymer matrix. The optical data storage medium desirably exhibits a nonlinear response to actinic radiation, i.e., experiences no substantial change in refractive index for incident laser light below a threshold, and significant changes in refractive index above the threshold. Advantageously, while recording into such a medium is only possible with the light having a power, or intensity, exceeding a threshold value, the recorded data can be repeatedly and substantially non-destructively read with light having an intensity below the threshold. Microholograms recorded in the present optical data storage media are expected to be smaller in size than the beam used to record them. Finally, the media comprises a sensitizer capable of absorbing actinic radiation at about 405 nm to cause upper triplet-to-triplet energy transfer to said reactant, so that storage capacity of the media is optimized, while the media is yet compatible with current conventional storage formats, e.g., Blu-ray.

The optical data storage media comprises a non-linear sensitizer and a reactant dispersed within a polymer matrix. The non-linear sensitizers are capable of absorbing incident actinic radiation, e.g., in the form of one or more photons, and then transferring the energy to the reactant molecule to induce a molecular rearrangement of the reactant into a product that, in turn, gives rise to modulations in the refractive index of the medium. This modulation records both the intensity and phase information from the incident actinic radiation as the hologram. The advantages of the use of nonlinear (or "threshold") sensitizers as opposed to linear sensitizers can be further understood with references to FIGS. 1A, 1B, and 2.

Figure 1B:
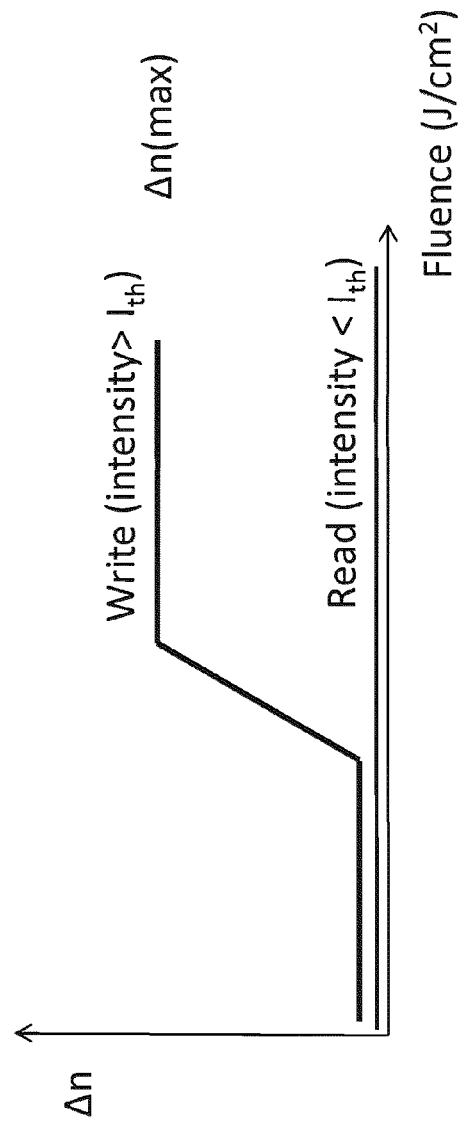
FIG. 1B is a graphical depiction of the response of a threshold sensitizer to actinic radiation.

More specifically, FIG. 1A shows the response of a linear photosensitive material to incident actinic radiation, while FIG. 1B shows the response of a threshold material to incident actinic radiation. As is shown in FIG. 1A, linear photosensitive materials will cause a reaction at any power density (intensity) of recording light and the amount of the refractive index change ($\Delta n$) achieved will be the same for the same radiative energy (fluence) received by the material. In contrast, threshold materials will only cause a reaction at and over a certain light intensity of recording light.

Figure 2:
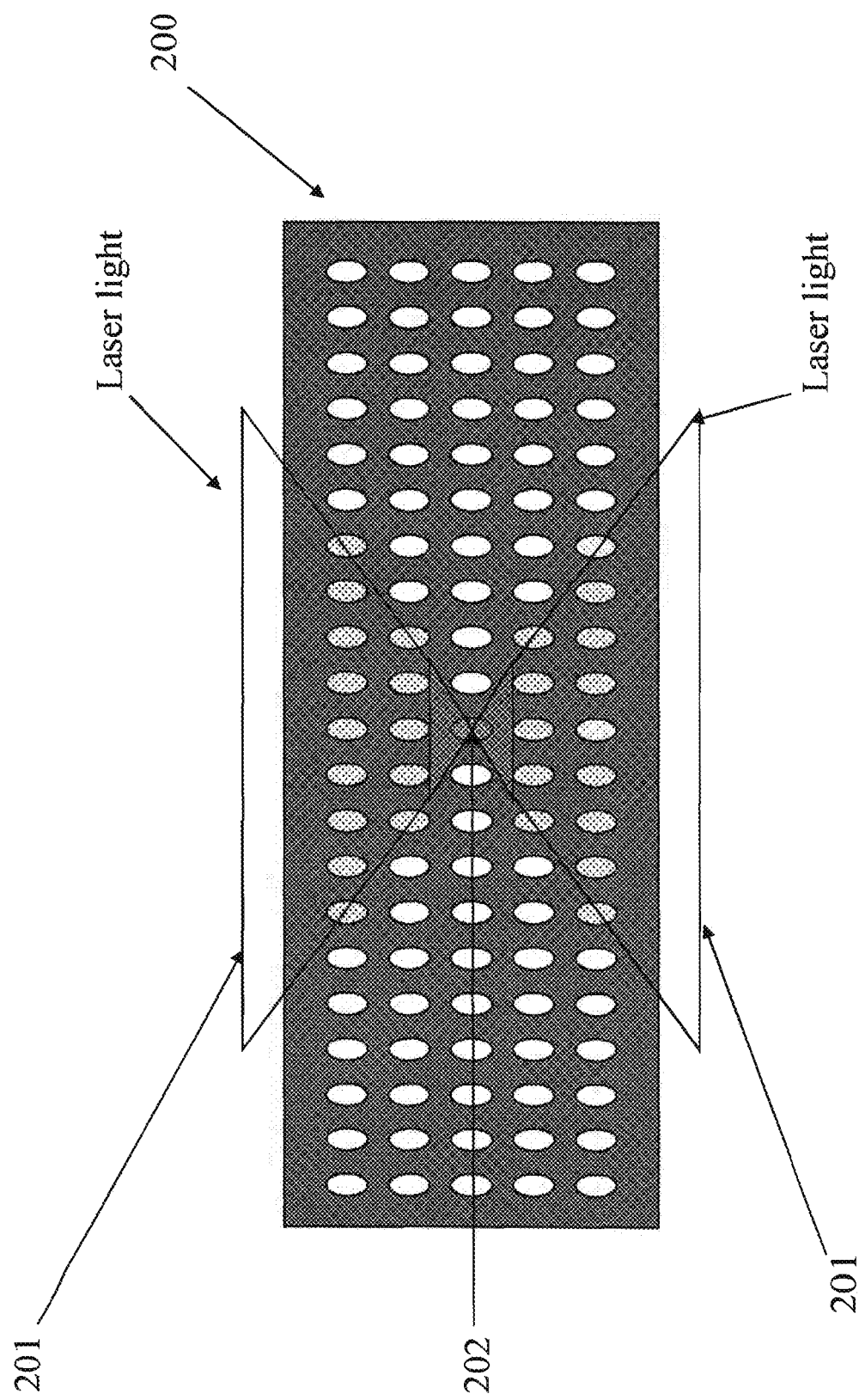
FIG. 2 is a cross-sectional view of an optical storage media, showing the area of impact of actinic radiation if the media comprises a linear sensitizer and the area of impact of actinic radiation if the media comprises a threshold sensitizer.

As a result, and as is shown in FIG. 2, in optical data storage media 200 comprising linear photosensitive materials, consumption of dynamic range will occur in non-addressed volumes, substantially everywhere actinic radiation passes through, shown as sections 201. In contrast, if optical data storage media 200 comprises threshold materials, consumption of dynamic range in non-addressed volumes is reduced or eliminated and consumption will occur substantially only in the target volume, i.e., at the focal point 202 of the actinic radiation. The use of threshold materials in the present optical data storage medium thus facilitates recording into a layer of bit-wise data buried in the bulk of the medium without disruption of adjacent layers of previously recorded data or vacant space available for subsequent recording. Also, as the light intensity in a tightly focused laser beam varies dramatically through the depth of the focal spot and is usually at its maximum at the beam waist (narrowest cross section), the threshold response of the medium will naturally restrict material conversion to occur only in the immediate vicinity of the beam waist. This may lead to a reduction in microhologram size within each layer, thus facilitating an increase in layer data storage capacity of the present media, so that the overall data storage capacity of the media may also be increased. The optical data storage media comprising the threshold materials will also advantageously be substantially stable in ambient light, so that exposure to the same does not result in substantial deterioration or damage to the media.

As mentioned above, the nonlinear sensitizers used in the present compositions and optical data storage media are capable of transferring energy from an upper triplet state ($T_n$, wherein n>1), which has a very short lifetime (nanoseconds to a few $\mu$ (micro) seconds), to the reactant. The ability to transfer energy from the $T_n$ state provides the optical data storage media provided herein with its nonlinear, threshold properties. That is, $T_n$ excited state absorption is only appreciable when the sensitizer is excited by high-intensity light, e.g., light having an intensity at least 2 orders of magnitude or more greater than ambient light, and negligibly small when subjected to low-energy radiation. This allows for the present optical data storage media, comprising the nonlinear sensitizers, to remain substantially transparent and inert to low intensity radiation, e.g., reading or ambient light, and to only change its properties (absorbance and thus, refractive index) in response to high energy recording light at or near the focal points. As a result, the present optical data storage media exhibits the threshold behavior desired and/or necessary for the bit-wise recordation of microholographic data.

FIG. 3 is a schematic energy level diagram showing the upper triplet $T_n$ excited state absorption and resulting energy transfer for a sensitizer exhibiting reverse saturable absorption. As shown in energy level diagram 300, arrow 301 illustrates the ground state absorption cross section of a photon as it transitions from the singlet ground state $S_0$ to a first excited state $S_1$. The intersystem-crossing rate, represented by arrow 302, signifies the transfer of energy that occurs when the sensitizer moves from an excited singlet state $S_1$ to a corresponding triplet state $T_1$. Arrow 303 indicates the excited triplet state absorption cross section. Once the upper level triplet state $T_n$ is achieved by subsequent linear absorption, two upper excited decay processes are possible. One possible decay process, denoted by arrow 304 in FIG. 3, is the non-radiative relaxation by internal conversion (IC) to the lower lying $T_1$ state. The other possible decay process is denoted by arrow 305 in FIG. 3, and involves the release of energy from the sensitizer and the transfer of this energy to the reactant via triplet-triplet energy transfer. The reactant then undergoes a change denoted by arrow 306 to form the holographic grating and record the data there.

The amount of nonlinear sensitizer used in the optical data storage media can depend on its optical density at the wavelength of light used to record the hologram. Solubility of the sensitizer may also be a factor. Generally speaking, the sensitizer may be used in an amount of from about 0.002 weight % to about 5 weight % based upon the total weight of the optical data storage media.

In some embodiments, the optical data storage media is expected to exhibit refractive index changes ($\Delta n$) suitable for the recordation of microholograms at high data densities, e.g., refractive index changes of at least about 0.005, or at least about 0.05, or even greater. Because of the refractive index change/diffraction efficiencies achievable by the present optical data storage media, the media may be capable of storing about 1 TB of information on a disk comparable in size to a single CD or single DVD.

Also, the use of the reactants disclosed herein provides a significant decrease in birefringence as compared to conventional reactants. Finally, the optical recording media described provides the ability to rapidly create high-resolution micro-holograms with minimal heat formation and signal leakage to neighboring locations that can result in smearing of the captured holographic pattern.

The reactant is usually present in relatively high concentrations both to yield large changes in optical properties within the polymer matrix and to promote more efficient triplet energy transfer. For example, the reactant may be present in the optical data storage media in amounts of from about 2 weight % to about 80 weight %, based upon the total weight of the optical data storage media.

The reactant(s) may provide the possibility of a higher loading in the optical data storage media when derivatized on a polymer backbone than conventional reactants. That is, whereas loading of conventional reactants when derivatized on a polymer backbone may be limited to no more than about 30 wt %, the novel reactants described here can be loaded onto polymer backbones at much greater loadings, i.e., even up to about 90 wt %, based upon the total weight of the optical data storage media.

The reactant may be covalently attached, or otherwise associated with, the polymer matrix of the optical data storage media. For example, polymers functionalized with cinnamates may be utilized as the polymer matrix, and e.g., polyvinyl cinnamates are readily commercially available. In this case, the optical data storage media may comprise higher loading amounts of the reactants, e.g., up to about 90 weight %, based upon the total weight of the optical data storage media.

If utilized, any desired mediator may be covalently attached to, or otherwise associated with, the polymer matrix. Incorporating the mediator into the polymer matrix in this way can allow for higher concentrations of the mediator to be utilized, which, in turn, can increase recording efficiency of the data storage media.

The desired sensitizer and reactant, and optional photostabilizer and mediator, may be substantially uniformly dispersed through a polymer matrix, or may be dispersed in any fashion so that bit-wise data recordation is facilitated within the optical data storage medium. The polymer matrix may comprise a linear, branched or cross-linked polymer or co-polymer. Any polymer may be used so long as the sensitizer and reactant can be substantially uniformly dispersed therein. Further, any polymer utilized will desirably not substantially interfere with the upper triplet energy transfer process. The polymer matrix may desirably comprise a polymer that is optically transparent, or at least has a high transparency at the wavelength contemplated for recording and reading the optical data storage medium.

Particular examples of suitable polymers for use in the polymer matrix include, but are not limited to, poly(alkyl methacrylates), such as poly(methyl methacrylate) (PMMA), polyvinyl alcohols, poly(alkyl acrylates), polystyrenes, polycarbonates, poly acrylates, poly(vinylidene chloride), poly (vinyl acetate), and the like.

The polymer matrix may also contain a plasticizer, such as dibutyl phthalate, dibutyl sebacate or di(2-ethylhexyl) adipate. Plasticizers can enhance recording efficiencies by facilitating molecular motion. Typical plasticizer levels can range from about 1 weight % to about 20 weight %, based upon the total weight of the storage media, or from about 2 weight % to about 10 weight %.

The optical data storage media described herein may be in a self-supporting form. Or, the data storage media may be coated onto a support material, such as polymethyl(methacrylate) (PMMA), polycarbonate, poly(ethylene terephthalate), poly(ethylene naphthalate), polystyrene, or cellulose acetate. Inorganic support materials such as glass, quartz or silicon may also be used, in those embodiments wherein use of a support material may be desired.

In such embodiments, the surface of the support material may be treated in order to improve the adhesion of the optical data storage media to the support. For example, the surface of the support material may be treated by corona discharge prior to applying the optical data storage media. Alternatively, an undercoating, such as a halogenated phenol or partially hydrolyzed vinyl chloride-vinyl acetate copolymer can be applied to the support material to increase the adhesion of the storage media thereto.

Generally speaking, the optical data storage media described herein can be prepared by blending the desired sensitizer, reactant, mediator (if desired) and polymer matrix. Proportions of these may vary over a wide range, and the optimum proportions and methods of blending may be readily determined by those of ordinary skill in the art. For example, the sensitizer may be present in concentrations of from about 0.01 weight % to about 90 weight %, and the reactant may be present in concentrations of from about 2 weight % to about 80 weight %, or even up to about 90 weight %, based upon the total weight of the optical data storage media.

Example 1

Synthesis of Subphthalocyanine (sub-PCs)

Starting Chemicals:

4-Nitrophthalonitrile and tert-butylphthalonitrile (purchased from TCI), $NaNO_2$, 1-chloronaphthalene, KI, KBr, $BCl_3$ in $CH_2Cl_2$, $BCl_3$ in xylene, 3-iodophenol, 4-iodophenol, 3-bromophenol, 4-bromophenol, 3,5-dibromophenol, and 10% Pd/C (all purchased from Aldrich) were used as received.

Figure 6:
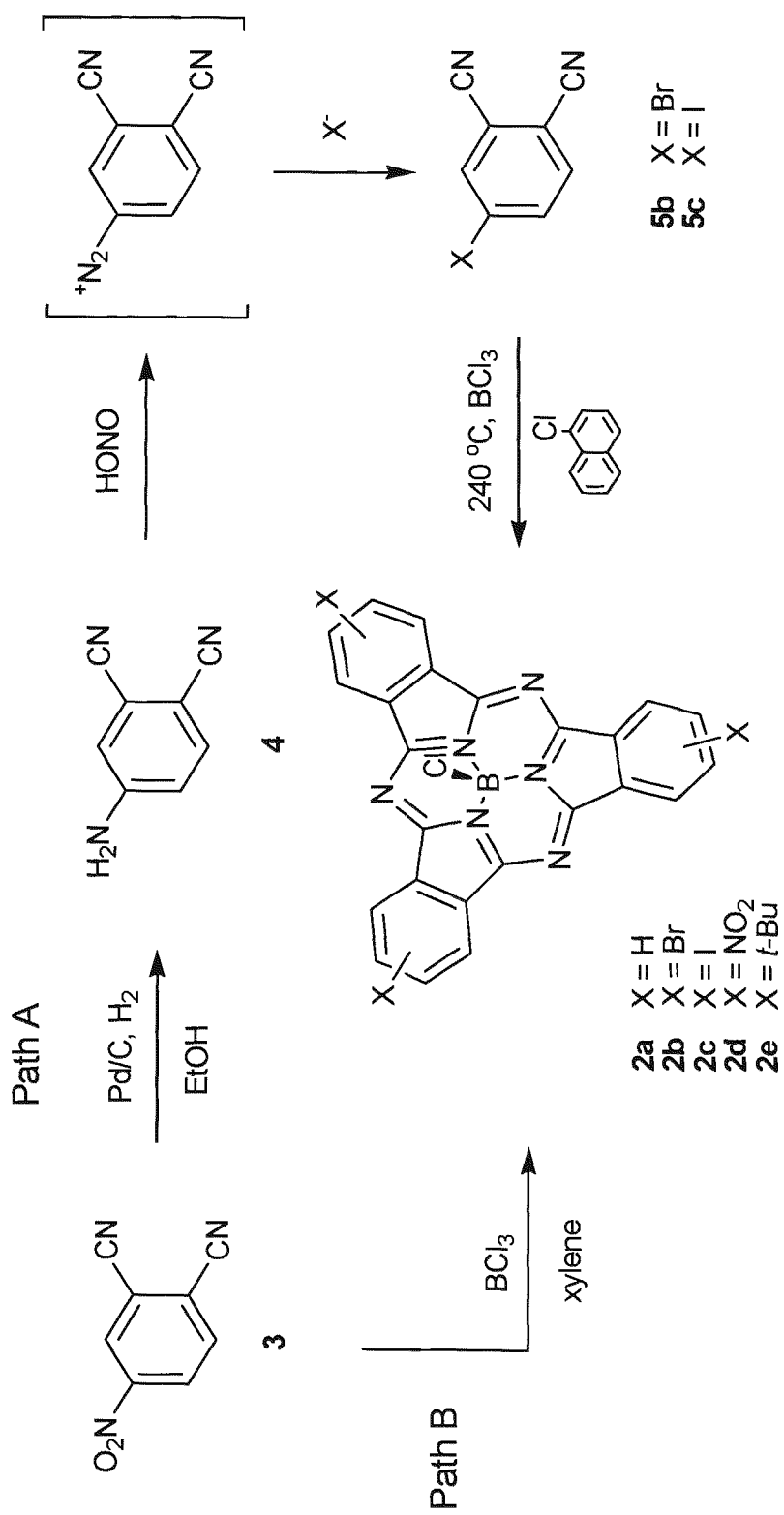
FIG. 6 is a schematic representation of the synthetic routes used to produced certain subphthalocyanine RSAs according to some embodiments.

Several synthetic routes, shown in FIG. 6, were taken to produce the sub-PCs having an absorption minimum at 405 nm. The parent, unsubstituted compound 2a, shown in FIG. 4, was available commercially. The ring halogenated sub-PCs started from 4-nitrophalonitrile, 3 in FIG. 6, and followed path A also shown in FIG. 6. Hydrogenation to the amine, followed by diazotization and subsequent reaction with a halide produced the desired 4-halophthalonitriles 4-bromophthalonitrile and 4-iodo-phthalonitrile. Boron templated sub-Pc syntheses at 240° C. in 1-chloronaphthalene completed preparation of sub-Pcs 2b and 2c shown in FIG. 6. The nitro and t-butyl derivatives (2d,e) were made directly from readily available 4-nitrophthalonitrile 5d and 4-t-butylphthalonitrile 5e, respectively via path B, all of which are also shown in FIG. 6.

Figure 7:
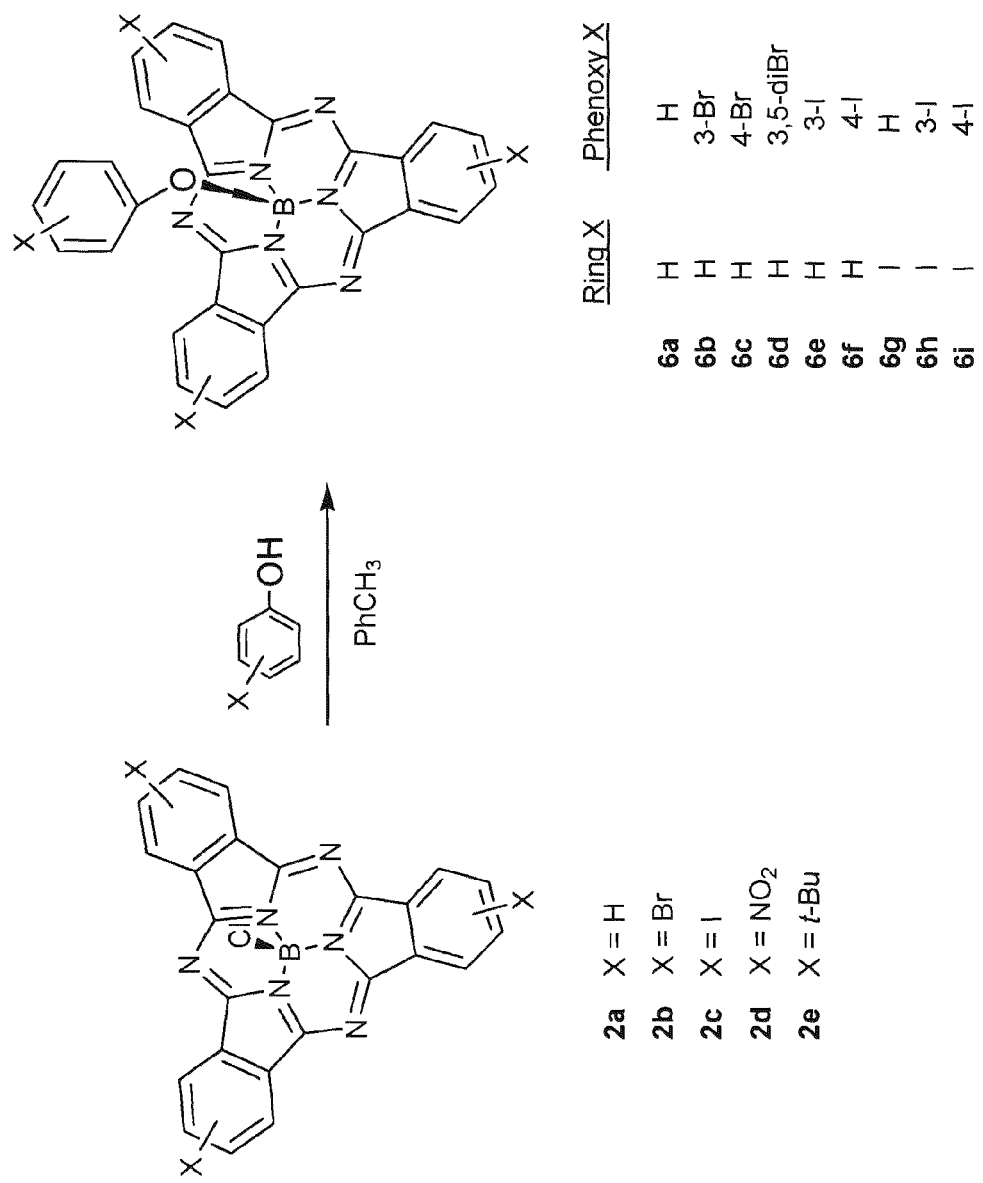
FIG. 7 is a schematic representation of the synthetic route used to produced phenoxy-substituted subphthalocyanine RSAs according to certain embodiments.

An alternative synthetic route, utilized to replace the axial boron ligand with a phenoxide derivative, is shown in FIG. 7. More specifically, and as shown, replacement of the axial boron ligand with a phenoxide derivative was accomplished by refluxing the corresponding phenol with the requisite sub-Pc in toluene. These were facile reactions giving yields between 50% and 95%.

$^1H$ and $^{13}C$ NMR spectra were obtained on a Bruker 400 MHz spectrophotometer. UV-Vis spectra were recorded on a Cary 300 Scan spectrometer.

4-amino-phthalonitrile (4)

4-nitrophthalonitrile (3, 60.0 g, 0.346 mol) was dissolved in 190 proof EtOH (528 g) in a pressure reactor to which was added 10% Pd/C (5.59 g) and then heated to 30° C. and pressurized to 60 psi with $H_2$. After 3 hrs, gas consumption ceased. The reaction mixture was purged with $N_2$, filtered through Celite® and concentrated to give 39.5 g (80%) product as a light brown powder. It was used without further purification in the next step. $^1$H NMR (DMSO-$d_6$) δ: 7.63 (d, J=8.8 Hz, 1H); 7.02 (d, J=2.0 Hz, 1H); 6.87 (dd, J=8.5, 2.0 Hz, 1H); 6.71 (s, 2H). $^{13}$C{$^1$H}NMR (DMSO-$d_6$): 153.5, 135.4, 118.0, 117.7, 117.4, 116.9, 116.0, 98.2 ppm. mp 174-176° C.

4-bromophthalonitrile (5b)

Compound 4 (24 g, 0.17 mol) was suspended in a stirring solution of 100 ml HBr (48%) and 100 ml of $H_2O$ cooled to −10° C. Sodium nitrite (14 g, 0.20 mol) was dissolved in ice water and added dropwise to the solution of 4-aminophthalonitrile. The exothermic reaction was carefully monitored and kept under 0° C. After 2 hours of stirring, the solution was added dropwise to a solution of Cu(I)Br (27 g, 0.18 mol) in 100 ml of HBr (48%) at −3° C. and stirred at 0° C. for 2 hours. To minimize foaming as well as increase the yield, methylene chloride was added to the solution and the reaction was allowed to proceed overnight for at least 24 hours. The organic layer was removed, and the aqueous layer was also extracted with toluene. The combined organic layers were washed with water, $Na_2S_2O_3$ (saturated aqueous solution), water, brine, water, dried over $MgSO_4$ and evaporated under reduced pressure. 25 g of an orange product were collected (73%). $^1$H NMR (CDCl$_3$) δ: 7.99 (d, 1H), 7.94-7.91 (dd, 1H), 7.72-7.70 (d, 1H).[6] $^{13}$C{$^1$H}NMR (CDCl$_3$) 136.68, 136.42, 134.44, 128.19, 117.39, 114.76, 114.65, 114.04 ppm.

4-iodo-phthalonitrile (5c)

A suspension of 4-aminophthalonitrile (4, 25.5 g, 0.178 mol) in 2.5M $H_2SO_4$ (350 mL) was cooled to −3° C. under $N_2$ and then a solution of NaNO$_2$ (13.8 g, 0.203 mol) in water (50 mL) was added slowly so as to keep the pot temperature <0° C. Stirring continued (with frothing) for 2 h. The orange mixture was then filtered to remove solids, while keeping the filtrate cold (~0° C.). The chilled orange filtrate was added to a cooled (~2° C.) solution of KI (31.5 g, 0.190 mol) in water (200 mL). A black precipitate formed immediately. Addition continued over 15 min then mixing continued for an additional 15 min. The ice bath was removed and the mixture stirred for 1 h. The solid was then collected by filtration, washed with water (2×50 mL), dissolved in toluene (250 mL) and washed with water (200 mL), sat NaHCO$_3$ (200 mL), water (200 mL), saturated sodium thiosulfate solution (100 mL), water (200 mL) and then dried over MgSO$_4$, filtered and stripped to give 21.9 g (48%) product. $^1$H NMR (CDCl$_3$) δ: 8.18 (d, J=1.5 Hz, 1H); 8.12 (dd, J=8.1, 1.5 Hz, 1H); 7.55 (d, J=8.4 Hz, 1H). $^{13}$C{$^1$H}NMR (CDCl$_3$): 142.5, 142.0, 134.0, 116.96, 115.03, 115.00, 113.91, 99.80 ppm. mp 140-143° C.

Chloro[2,9,16-tribromosubphthalocyanato]boron(III) (2b)

A solution of 4-bromophthalonitrile (5.0 g, 24 mmol) dissolved in 1-chloronaphthalene (6 mL, 44 mmol) was cooled to −78° C. A solution of 1M BCl$_3$ in methylene chloride (25 mL, 25 mmol) was added to the frozen mixture. As they both freeze, the temperature was ramped to 240° C. under $N_2$. The reaction was allowed to proceed for 35 min, then allowed to cool to room temperature and stirred overnight. A viscous mixture formed. Chloroform was added and the solvent was then evaporated under reduced pressure (3 mmHg) at 140° C. for 24 h. A soxhlet extraction is performed using dichloromethane and the solvent was again evaporated. The solid was dissolved in a minimal amount of chloroform (10 ml), then triturated with hexanes (150 ml) and the solvent was decanted. The process was repeated a second time, leading to a purified product. 0.34 g was recovered (5.8%). $^1$H NMR (CDCl$_3$) δ: 9.06 (s, 3H), 8.76 (dd, 3H), 8.10 (d, 3H). UV ($\lambda_{max}$, ε)=568 nm; 21,393.

Chloro[2,9,16-triiodosubphthalocyanato]boron(III) (2c)

A slurry of 4-iodo-phthalonitrile (5b, 4.8 g, 23.2 mmol) in 1-chloronaphthalene (15 mL) under $N_2$ was treated with BCl$_3$ in CH$_2$Cl$_2$ (23.2 mL 1.0 M). The temperature increased to 35° C. from ambient during the time. The mixture was heated to remove CH$_2$Cl$_2$ (a slight vacuum was applied to hasten the process) and then heated to 220° C. over 3 h in a heating mantle and then for an additional 2 h. The dark mixture was cooled, treated with hexanes (300 mL) and the precipitated solid collected, washed with hexanes (4×50 mL) and dried to give crude product (6.8 g) that was redissolved in CHCl$_3$ (~10 mL) and slowly precipitated into hexanes. The solid was collected and dried to give 1.61 g product (26%). $^1$H NMR (CDCl$_3$) δ: 9.26 (s, 3H); 8.59 (dd, J=8.3, 1.7 Hz, 3H); 8.26 (d, J=8.3 Hz, 3H).[3d] UV ($\lambda_{max}$, ε)=572 nm; 114,637.

Chloro[trinitrosubphthalocyanato]boron(III) (2d). A solution of BCl$_3$ (1M in xylene) was added into a mixture of 3-nitro-1,6-dicyanobenzene (5 g) in 30 mL of Xylene (mixture of isomers). The mixture was heated slowly to 120° C. while stirring in a heating mantle for 1 h before cooling it back to room temperature. The crude dark blue mixture was extracted with toluene in a soxhlet extractor for 2 hrs. As the isolated product in the thimble still looked impure, the product was purified using column chromatography (EtOAc:Hexane=5:95). After the purification of the major isomer (In the literature the this SubPc derivative was shown to be a mixture of two structural isomers with C1 and C3 symmetries in a 3:1 statistical distribution.), the major isomer was isolated by fractional crystallization with EtOAc/Hexane (3:7) and followed by suction filtration. $^1$H NMR (CDCl$_3$) δ: 9.8 (m, 3H); 9.1 (m, 3H); 8.9 (m, 3H).[3d] UV ($\lambda_{max}$, ε)=567 nm, 34,000.

Chloro[2,9,16-tri-tert-butyl- and Chloro[2,9,17-tri-tert-butylsubphthalocyanato]boron(III) (2e)

A solution of tert-butylphthalonitrile (5.53 g, 30 mmol) in chloronaphthalene (6 g) was cooled to −3° C. and stirred vigorously under N2 for 10 minutes. Boron trichloride (1M in methylene chloride) (17 ml, 17 mmol) was added dropwise via a syringe. The exothermic reaction was kept below 5° C. until all of the gas had dissipated. The reaction flask was then heated from room temperature to 240° C. and maintained at this temperature for 30 minutes, upon which the solution was returned to room temperature by radiational cooling. The solvent was evaporated under reduced pressure by rotary evaporation. The crude mixture was purified by soxhlet extraction using diethyl ether, followed by gravity column chromatography on silica gel (200-400, 60 Å) using hexanes/acetate as an eluent (7:3). Fraction 4 ($R_f$=0.84) contained the desired product and appeared as a pink spot under 365 nm UV light. ¹H NMR (CDCl₃) δ: 8.95 (d, 3H); 8.83-8.81 (t, 3H); 8.05-8.03 (d, 3H); 1.58 (s, 27H).[3d] UV ($\lambda_{max}$, ε)=570 nm; 37,347.

Phenoxy[subphthalocynato]boron(III) (6a)

Chloro[subphthalocyanato]boron(III) (2a) (0.50 g, 1.2 mmol) and phenol (0.57 g, 6.1 mmol) were combined in 6 mL of toluene, stirred and refluxed for 48 h. Upon cooling, the solution, it was further diluted in toluene, washed with 10% KOH, water, 10% KOH, water then the organic layer was dried over MgSO₄ and evaporated by rotary evaporation for 2 h at 95° C. under reduced pressure and the desired product isolated in 88% yield (0.50 g). ¹H NMR (CDCl₃) δ: 8.89-8.85 (m, 6H), 7.95-7.90 (m, 6H), 6.79-6.75 (t, 2H), 6.66-6.64 (t, 2H), 5.42-5.40 (d, 1H). UV ($\lambda_{max}$, ε)=565 nm; 87,759.

3-Bromophenoxy[subphthalocyanato]boron(III) (6b)

Chloro[subphthalocyanato]boron(III) (2a) (0.50 g, 1.2 mmol) was combined with 3-bromophenol (1.0 g, 5.8 mmol) in a 100 ml single neck round bottom flask. Toluene was added (4 ml) and the content is refluxed for 48 h. The solution was dissolved in toluene, washed with 10% KOH, water, dried over MgSO₄. Upon evaporation, 0.60 g was isolated (91%). ¹H NMR (CDCl₃) δ: 8.91-8.88 (m, 6H), 7.94-7.93 (m, 6H), 6.76 (d, 1H), 6.66-6.62 (t, 1H), 5.66-5.65 (t, 1H), 5.27-5.24 (dd, 1H). ¹³C{¹H} (CDCl₃) 153.6, 151.4, 130.94, 130.91, 12.9, 124.6, 122.7, 122.3, 121.9, 117.3 ppm. UV ($\lambda_{max}$, ε)=566 nm; 78,895.

4-Bromophenoxy[subphthalocyninato]boron(III) (6c)

Chloro[subphthalocyanato]boron(III) (2a) (0.50 g, 1.2 mmol) was dissolved in 5 ml of toluene in a 50-ml single neck round bottom flask. 4-bromophenol (1.0 g, 5.8 mmol) was added to the flask and the solution is refluxed. After 48 h, solution was cooled, extracted in 40 ml of CHCl₃, washed with 10% KOH (20 ml), water, 10% KOH, water, dried over MgSO₄, filter though a medium porosity fritted funnel. Evaporation of the solvent yielded 0.44 g of a purple solid (68%) ¹H NMR (CDCl₃) δ: 8.89-8.86 (m, 6H), 7.94-7.92 (m, 6H), 6.87-6.85 (d, 2H), 5.31-5.29 (d, 2H). ¹³C{¹H}NMR (CDCl₃) 151.73, 151.32, 131.83, 130.93, 129.96, 122.27, 120.94, 114.05 ppm. UV ($\lambda_{max}$, ε)=565 nm; 53,562.

3,5-dibromophenoxysubphthalocyaninato]boron(III) (6d)

A mixture of Chloro[subphthalocyanato]boron(III) (2.1 g, 6.17 mmol) and 3,5-dibromophenol (3 g, 0.015 moles) were refluxed together in toluene (150 mL) under N₂ for 3 days then cooled and the residue was evaporated, washed with 10% KOH (50 mL), water (50 mL), brine (50 mL), extracted with CHCl₃, dried over MgSO₄, concentrated, and slurried with hexanes to precipitate product which was isolated and dried to give 1.82 g product. ¹H NMR (CDCl₃) δ: 8.9 (m, 6H); 7.9 (m, 6H); 6.9 (s, 1H); 5.5 (s, 2H). UV ($\lambda_{max}$, ε)=562 nm, 84,767.

3-Iodophenoxysubphthalocyaninato]boron(III) (6e)

A mixture of Chloro[subphthalocyanato]boron(III) (0.515 g, 1.5 mmol) and 3-iodophenol (0.660 g, 3.78 mmol) were refluxed together in toluene (15 mL) under N₂ for 48 h then cooled and the residue was evaporated, washed with 10% KOH (50 mL), water (50 mL), brine (50 mL), extracted with CHCl₃, dried over MgSO₄, concentrated, and slurried with hexanes to precipitate product which was isolated and dried to give 490 mg product. ¹H NMR (CDCl₃) δ: 8.9 (m, 6H); 7.9 (m, 6H); 6.9 (d, 1H); 6.5 (t, 1H); 5.85 (t, 1H); 5.75 (m, 1H); 5.28 (dd, 1H). UV ($\lambda_{max}$, ε)=563 nm, 69,504.

4-Iodophenoxy[subphthalocyninato]boron(III) (6f)

Chloro[subphthalocyaninato]boron(III) (2a) (0.52 g, 1.2 mmol) was combined with 4-Iodophenol (1.3 g, 6.1 mmol) in a single-neck round bottom flask. 4 ml of toluene was added and the content is refluxed for 24 h. After cooling the solution, it was dissolved in additional toluene and washed with 10% KOH, water, 10% KOH, water, dried over MgSO₄. After evaporating the solvent, 0.71 g of product was recovered (95%). ¹H NMR (CDCl₃) δ: 8.89-8.87 (m, 6H), 7.96-7.93 (m, 6H), 7.06-7.03 (dd, 2H), 5.19-5.17 (dd, 2H). ¹³C{¹H} NMR (CDCl₃): 152.5, 151.3, 137.8, 130.9, 130.0, 122.3, 121.5, 84.4 ppm. UV ($\lambda_{max}$, ε)=565 nm; 82,461.

Phenoxy[2,9,16-triiodosubphthalocyaninato]boron(III) (6g)

A mixture of Chloro[2,9,16-triiodosubphthalocyaninato]boron(III) (0.52 g, 0.64 mmol) and phenol (0.30 g, 3.2 mmol) were refluxed together in toluene (6 mL) under N₂ for 18 h then cooled and the residue washed with 4:1 MeOH/water (2×50 mL), redissolved in toluene, subjected to chromatographic separation on a Chromatotron™ silica gel plate. Crude product was re-isolated, dissolved in CHCl₃, washed with water (3×100 mL), dried with Na₂SO₄, and concentrated to give 280 mg (51%) pure product as a purple solid with metallic luster. ¹H NMR (CDCl₃) δ: 9.21 (s, 3H); 8.56 (dm, J=8.4, 3H); 8.22 (d, J=8.4 Hz, 3H); 6.78 (t, J=7.8 Hz, 2H); 6.67 (t, J=7.1 Hz, 1H); 5.38 (d, J=7.6 Hz, 2H).[3c] UV ($\lambda_{max}$, ε)=572 nm; 114,311.

3-Iodophenoxy[2,9,16-triiodosubphthalocyaninato]boron(III) (6h)

A mixture of Chloro[2,9,16-triiodosubphthalocyaninato]boron(III) (0.62 g, 0.77 mmol) and 3-iodophenol (0.68 g, 3.1 mmol) were refluxed together in toluene (15 mL) under N₂ for 20 h then cooled and the residue washed with 4:1 MeOH/water (2×40 mL), 10% KOH (50 mL), water (50 mL), brine (50 mL), 4:1 MeOH/water (50 mL), brine, dried over Na₂SO₄, concentrated, and slurried with hexanes to precipitate product which was isolated and dried to give 680 mg (89%) product. ¹H NMR (CDCl₃) δ: 9.13 (d, J=13.4 Hz, 3H); 8.57 (dt, J=8.6, 1.8 Hz, 3H); 8.30 (m, 3H); 7.00 (d, J=7.8 Hz, 1H); 6.59 (t, J=7.8 Hz, 1H); 5.75 (m, 1H); 5.33 (dd, J=8.1, 1.5 Hz, 1H). UV ($\lambda_{max}$, ε)=571 nm; 103,000.

4-Iodophenoxy[2,9,16-triiodosubphthalocyaninato]boron(III) (6l)

A mixture of Chloro[2,9,16-triiodosubphthalocyaninato]boron(III) (0.62 g, 0.77 mmol) and 4-iodophenol (0.68 g, 3.1 mmol) were refluxed together in toluene (6 mL) under N₂ for 18 h then cooled and the residue washed with 4:1 MeOH/water (2×50 mL), 10% KOH (50 mL), 4:1 MeOH/water (50 mL), dried, concentrated, redissolved in CHCl₃, and triturated with hexanes to precipitate product which was isolated and dried to give 460 mg (60%) product. ¹H NMR (CDCl₃) δ:

9.13 (d, J=12.6 Hz, 3H); 8.57 (t, J=7.6, 3H); 8.31 (m, 3H); 7.10 (d, J=7.6 Hz, 2H); 5.20 (d, J=7.6 Hz, 2H). UV ($\lambda_{max}$, $\epsilon$)=572 nm; 141,429.

Example 2

Linear Optical Measurements

Figure 8A:
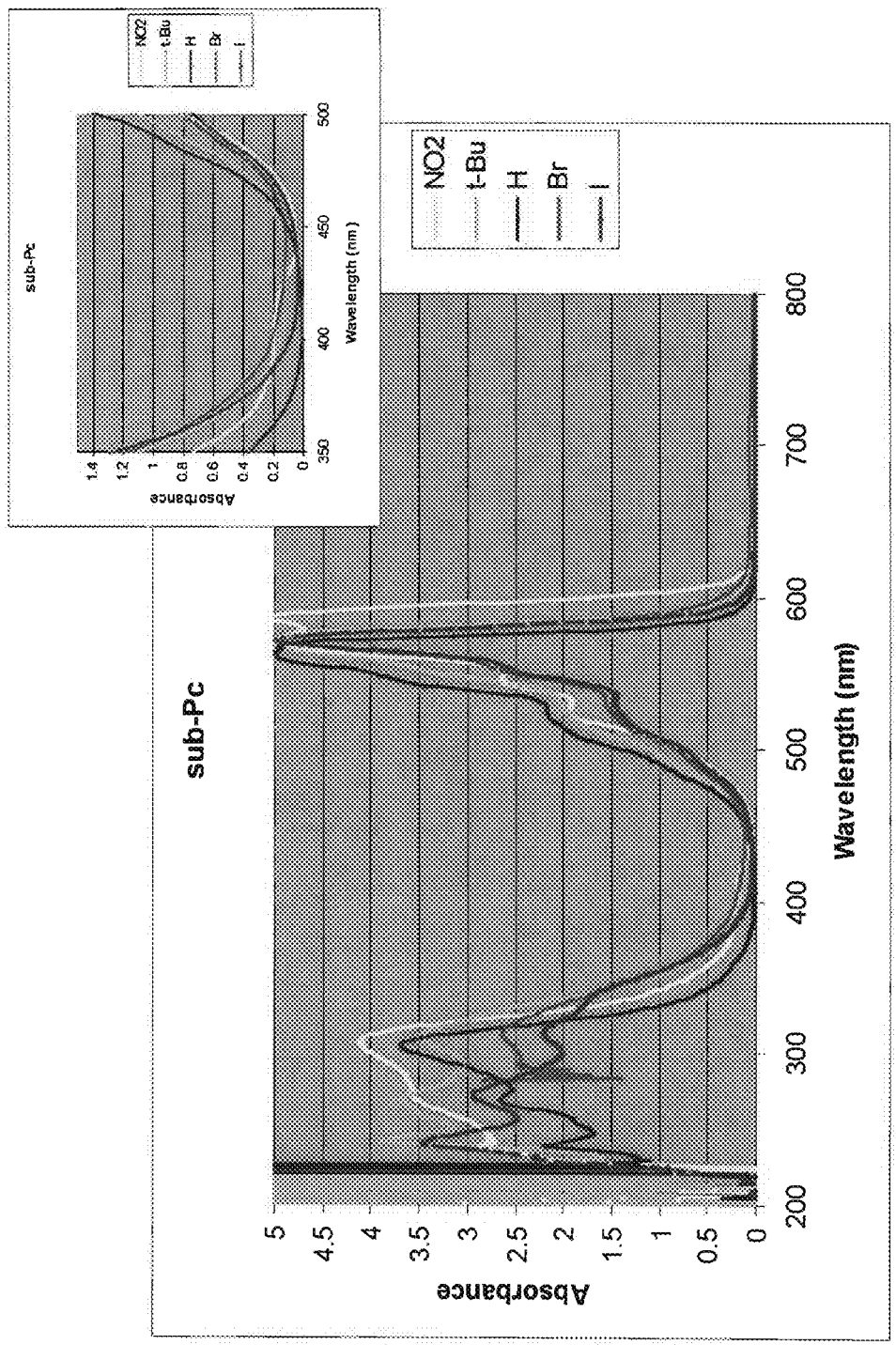
FIG. 8A is the UV-Vis spectra of ring-substituted, C1 axial ligand subphthalocyanine RSAs according to some embodiments.
Figure 8B:
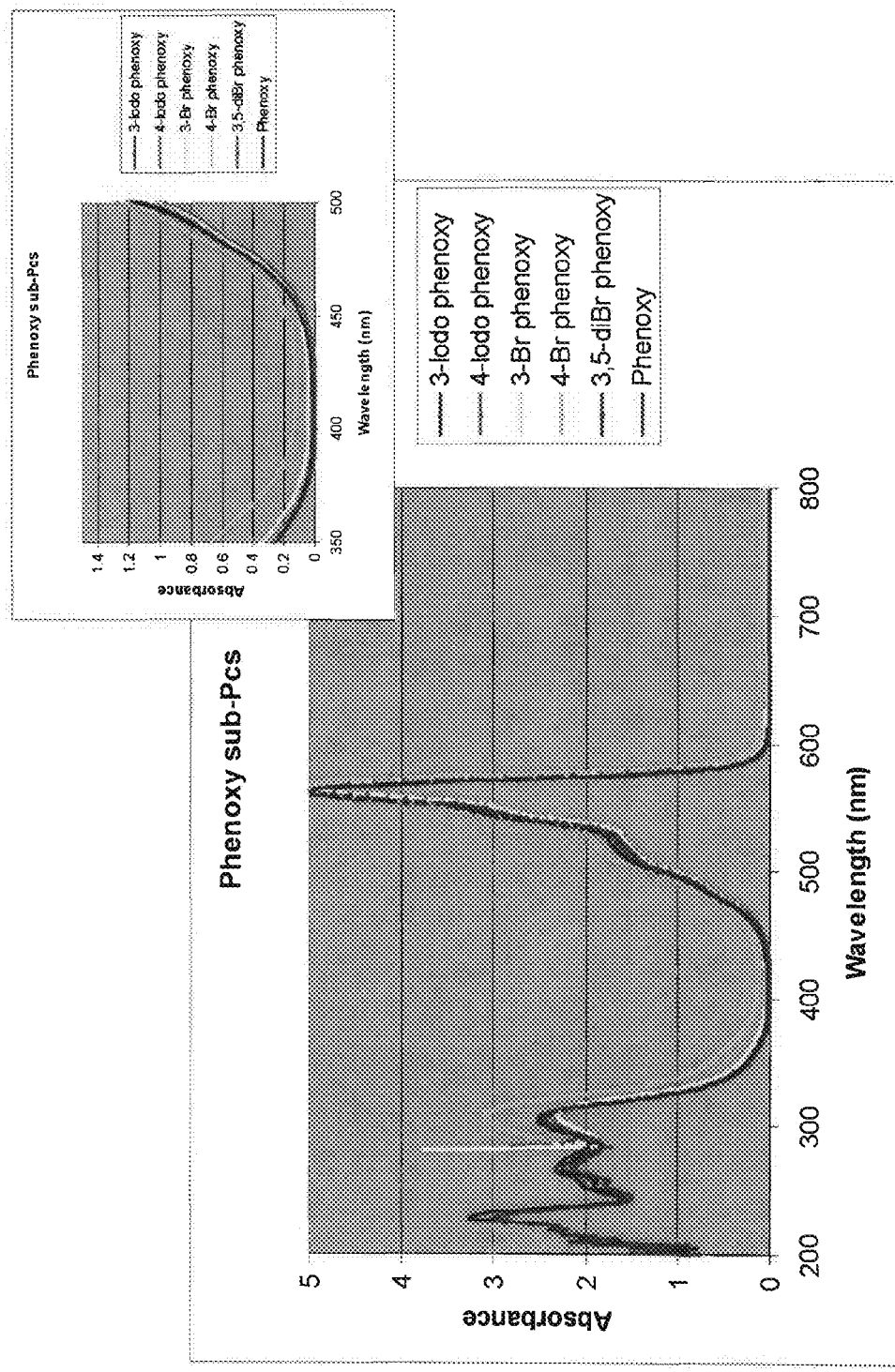
FIG. 8B is the UV-Vis spectra of phenoxy-substituted subphthalocyanines according to some embodiments.
Figure 8C:
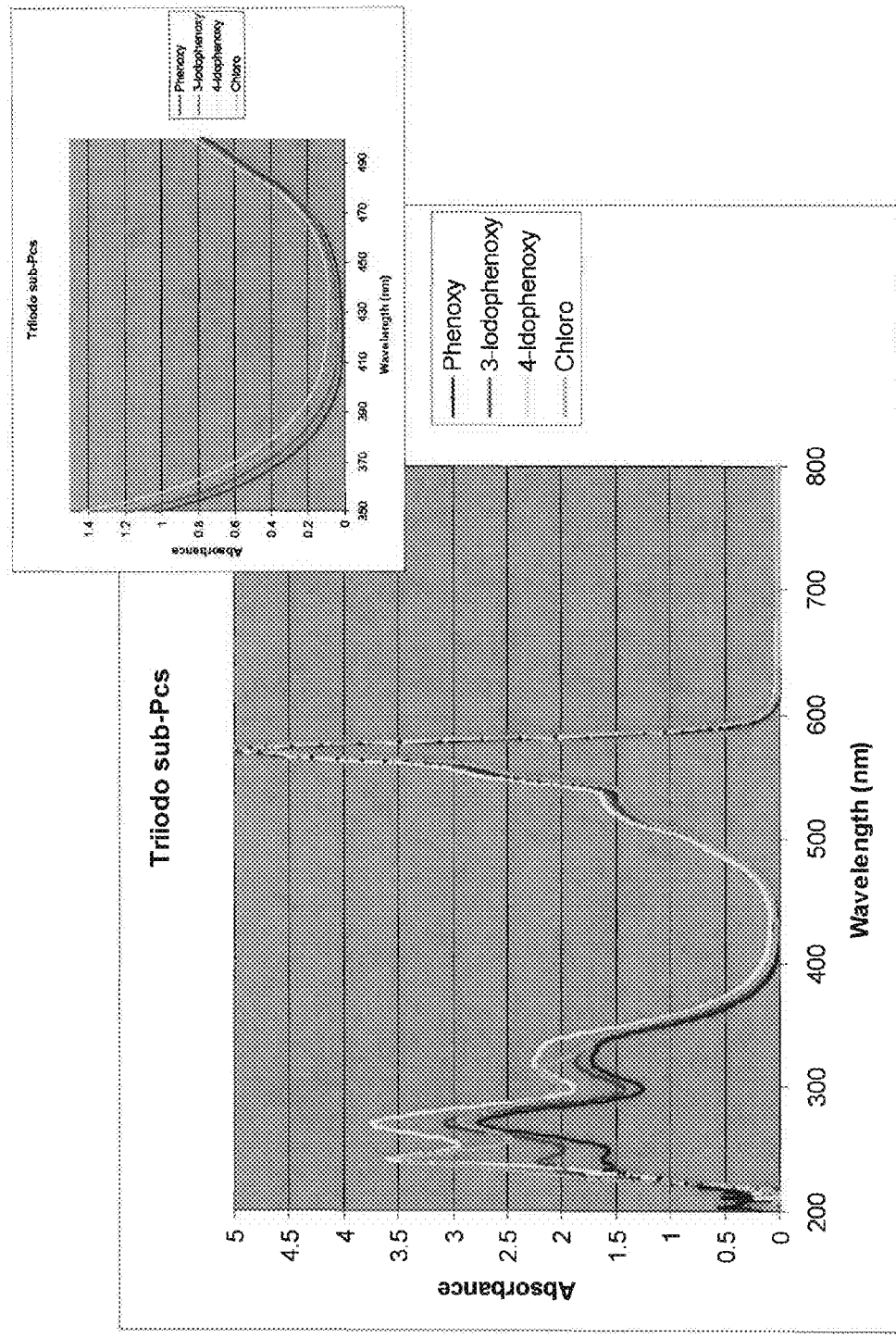
FIG. 8C is the UV-Vis spectra of triiodo-subphthalocyanines according to some embodiments.
Figures 9A, 9B, 9C, 9D, 9E:
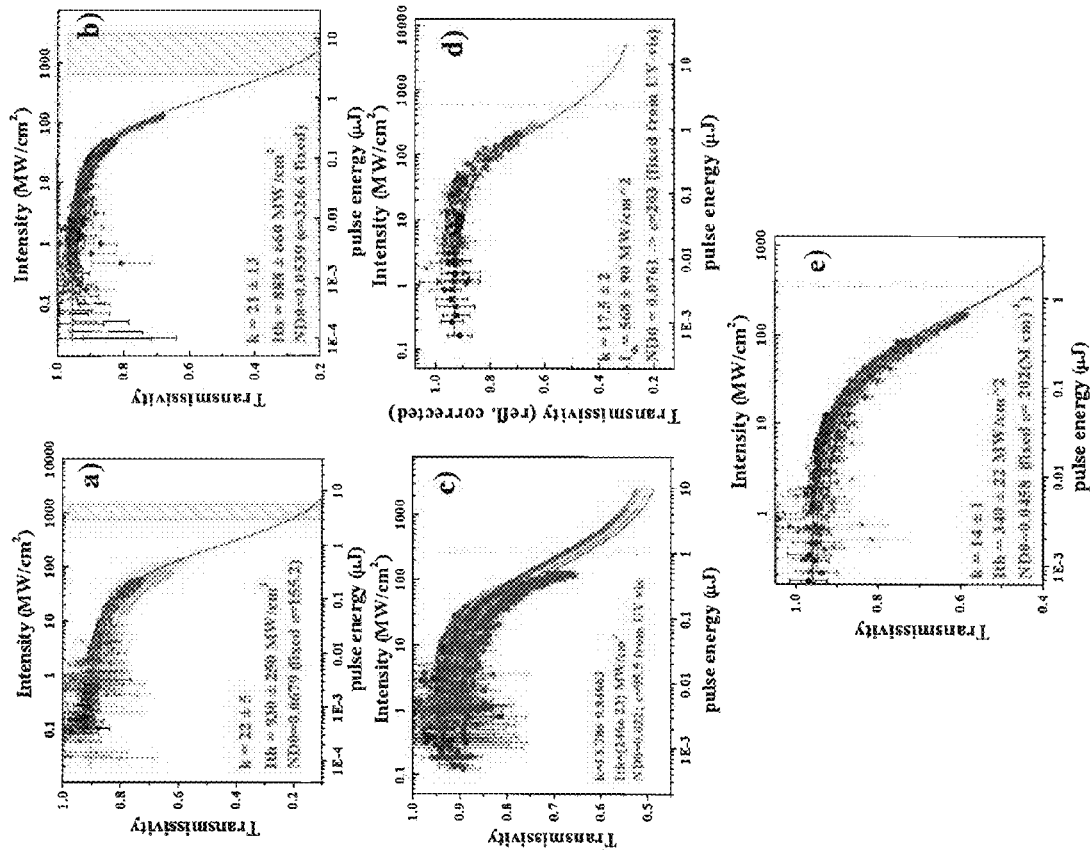
FIG. 9A is a graphical depiction of the Z-Scan measurements taken of a subphthalocyanine RSA (3-bromophenoxy[subphthalocyanato]boron(III) (6b)) according to some embodiments.
FIG. 9B is a graphical depiction of the Z-Scan measurements taken of a subphthalocyanine RSA (4-bromophenoxy[subphthalocyninato]boron(III) (6c)) according to some embodiments.
FIG. 9C is a graphical depiction of the Z-Scan measurements taken of a subphthalocyanine RSA (3,5-dibromophenoxysubphthalocyaninato]boron(III) (6d)) according to some embodiments.
FIG. 9D is a graphical depiction of the Z-Scan measurements taken of a subphthalocyanine RSA (3-iodophenoxysubphthalocyaninato]boron(III) (6e)) according to some embodiments.
FIG. 9E is a graphical depiction of the Z-Scan measurements taken of a subphthalocyanine RSA (4-iodophenoxy[subphthalocyninato]boron(III) (6f)) according to some embodiments.
Figures 10A, 10B, 10C, 10D:
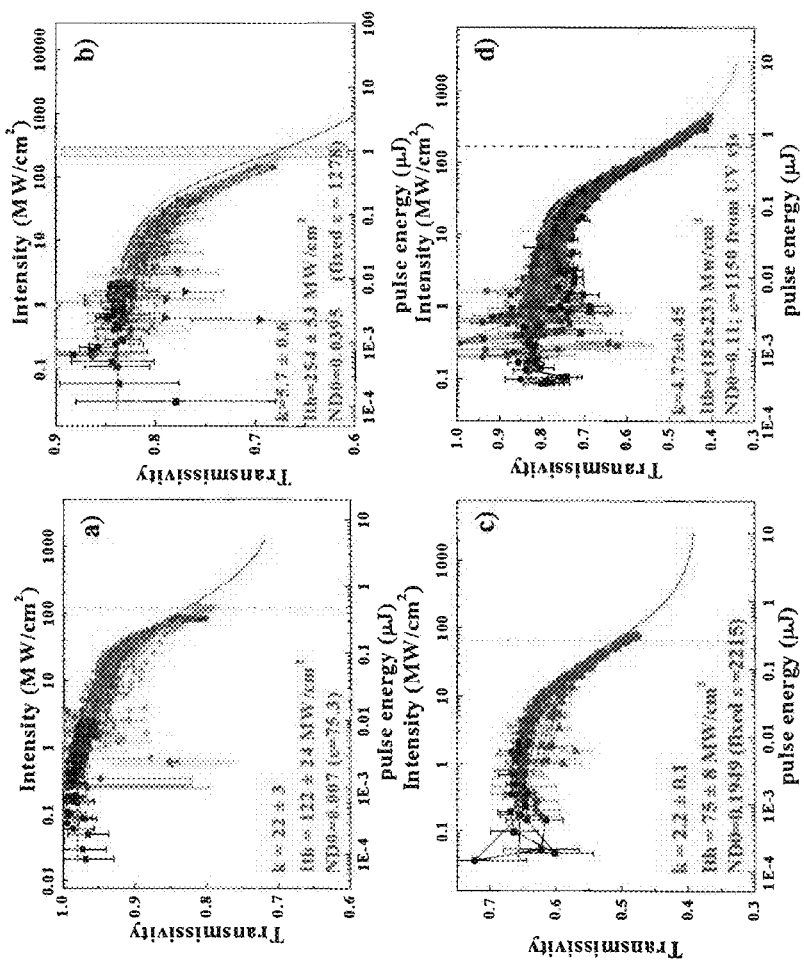
FIG. 10A is a graphical depiction of the Z-Scan measurements taken of a subphthalocyanine RSA (chloro[subphthalocyanato]boron(III) (2a)) according to some embodiments.
FIG. 10B is a graphical depiction of the Z-Scan measurements taken of a subphthalocyanine RSA (chloro[2,9,16-triiodosubphthalocyanato]boron(III) (2c)) according to some embodiments.
FIG. 10C is a graphical depiction of the Z-Scan measurements taken of a subphthalocyanine RSA (chloro[trinitrosubphthaloxyanato]boron(III) (2d)) according to some embodiments.
FIG. 10D is a graphical depiction of the Z-Scan measurements taken of a subphthalocyanine RSA (phenoxy[2,9,16-triiodosubphthalocyaninato]boron(III) (6g)) according to some embodiments.

As mentioned above, minimal absorption at 405 nm is required for blue sub-PC RSA dyes. UV-Vis spectra were taken of the subphthalocyanine RSAs prepared according to Example 1, and FIGS. 8A-8C show the UV-Vis spectra of a series of sub-Pcs. All measurements were taken in $CHCl_3$ at ~5 mg/50 mL or ~5 mg/5 mL for concentrated samples and plots normalized to 5 absorbance units.

The dyes that contained the Cl axial ligand are shown in FIG. 8A. As can be seen, all the compounds display the same basic profile, with a $\lambda_{max}$~565 nm and a nearly transparent window in the 400-450 nm range. Subtle differences can be seen in the inset plot. The nitro-substituted RSA dye chloro[trinitrosubphthalocynato]boron(III) (2d) shows a small but significant peak at ~410 nm that manifests itself as unwanted linear absorbance. From FIG. 8A, it appears that the unsubstituted sub-Pc Phenoxy[subphthalocynato]boron(III) (2a) has the lowest absorption at 405 nm.

When the ring remains unsubstituted but the axial Cl ligand is replaced by a phenoxy group, there is less dramatic shifting of the spectra (FIG. 8B). In fact, exchanging halide for a phenoxy ligand results in lower absorbance at 405 nm.

The final set of subphthalocyanine RSA dyes synthesized were the ring-iodinated materials (FIG. 8C). Variation in the axial ligand for these compounds resulted in small changes in the absorption spectra. Again, from the transparency at 405 nm, the simple phenoxy substituted iodo sub-Pc was the most desired. The data from this Example is summarized in Table 1, below.

TABLE 1

| Compound | Ring X | Axial Ligand | $\lambda$max | $\epsilon_{\lambda max}$ | $\epsilon_{405}$ |
| --- | --- | --- | --- | --- | --- |
| 2a | H | Cl | 565 | 85,104 | 123 |
| 2b | Br | Cl | 572 | 54,815 | 2065 |
| 2c | I | Cl | 572 | 114,637 | 2823 |
| 2d | $NO_2$ | Cl | 562 | 33,000 | 2271 |
| 2e | t-Bu | Cl | 571 | 37,347 | 460 |
| 6a | H | PhO | 565 | 87,759 | 116 |
| 6b | H | 3-Br PhO | 566 | 78,895 | 133 |
| 6c | H | 4-Br PhO | 565 | 53,562 | 271 |
| 6d | H | 3,5-diBr | 562 | 84,767 | 146 |
| 6e | H | 3-I PhO | 563 | 69,504 | 103 |
| 6f | H | 4-I PhO | 565 | 82,461 | 194 |
| 6g | I | PhO | 572 | 114,311 | 444 |
| 6h | I | 3-I PhO | 571 | 103,000 | 937 |
| 6i | I | 4-I PhO | 572 | 141,429 | 1298 |

Example 3

Non-Linear Optical Measurements

Nonlinear optical absorption experiments were employed to determine the non-linearity of the sub-PCs. The measurements were done using a 5 ns pulsed tunable laser system operating at the 405 nm wavelength. Z-scan is one of the common nonlinear-optical techniques to asses non-linearity in material absorbance and has been documented in the literature (e.g. "Nonlinear Optics of Organic Molecules and Polymers", Edited by H. S. Nalwa and S. Miyata, CRC Press 1997). Briefly, Z-scan is a technique in which the sample is moved through a focused laser beam, causing the light intensity on sample to change, and changes in the sample's transmissivity are measured as a function of position. Alternatively, a sample may be subjected to a focused pulsed laser beam of variable power, and the transmissivity at the laser wavelength may be directly measured as a function of the light intensity (optical flux) of the incident radiation. Both approaches result in a dependence of the dye's transmissivity upon the incident light intensity, which constitutes its nonlinear optical response.

These dependencies are then analyzed to obtain two parameters that characterize the behavior of the sub-PCs: the threshold intensity ($I_{th}$)—the energy flux at which the nonlinear response "turns on," and the "k value"—the enhancement factor that describes the achievable ratio between the high- and low-intensity absorption cross-sections. These parameters define the range of optical power that can utilize the dye properties, and how efficient the reverse saturable absorption process is. The goal is to minimize the threshold value and maximize the k value.

The dye concentrations were chosen to achieve transmission around 0.8-0.9. The high boiling solvent o-dichlorobenzene was used as a solvent and after mixing with the sub-PCs, the solutions were filtered and placed in 1 mm cuvette for Z-scan measurements. o-dichlorobenzene was utilized to reduce the possibility of boiling the liquid on exposure to higher laser powers.

FIGS. 9A-9E shows the normalized transmission vs pulse energy data for sub-Pcs 3-Bromophenoxy[subphthalocyanato]boron(III) (a), 4-Bromophenoxy[subphthalocyninato]boron(III) (b), 3,5-dibromophenoxysubphthalocyaninato]boron(III) (c), 3-Iodophenoxysubphthalocyaninato]boron(III) (d) and 4-Iodophenoxy[subphthalocyninato]boron(III) (e) at varying laser intensities. These data were obtained from the dependence of normalized transmission against Z-position. As shown, all of these phenoxy-substituted sub-PCs exhibited mid-range k values indicating moderate non-linear optical behavior. As also can be seen in these graphs, at low pulse energies very low levels of the beam are absorbed and most of the light is transmitted through the sample. However, as the pulse energies increases, more and more of the light is absorbed and so the amount of light transmitted is less, demonstrating the nonlinear effect of the dye. Compounds that don't display RSA behavior would not display the drop in transmitted light at higher pulse energies. The multiple lines within each plot represent multiple experiments on the same individual compounds.

FIGS. 10A-10D show the normalized transmission vs. pulse energy data for 2a (a), 2c (b), 2d (c) and 6g (d) dyes. This set of RSA dyes showed small k values for the axial chloride sub-Pcs. A larger value of 22 was seen for the simple unsubstituted derivative 2a.

Table 2 summarizes the data obtained from the Z-scan measurements.

TABLE 2

| Dyes | Ring X | Axial Ligand | Extinction coefficient (@ 405 nm, 1/M/cm) | $I_{th}$ MW/cm$^2$ | $\Delta I$ | k | $\Delta k$ |
| --- | --- | --- | --- | --- | --- | --- | --- |
| 2a | H | Cl | 75 | 122 | ±24 | 22 | ±3 |
| 2c | I | Cl | 1278 | 254 | ±53 | 5.7 | ±0.6 |
| 2d | $NO_2$ | Cl | 2215 | 75 | ±8 | 2.2 | ±0.1 |
| 6b | H | 3-Br PhO | 155 | 930 | ±250 | 22 | ±5 |
| 6c | H | 4-Br PhO | 327 | 888 | ±660 | 21 | ±13 |

TABLE 2-continued

| Dyes | Ring X | Axial Ligand | Extinction coefficient (@ 405 nm, 1/M/cm) | $I_{th}$ MW/cm² | ΔI | k | Δk |
|---|---|---|---|---|---|---|---|
| 6d | H | 3,5-diBr | 96 | 246 | ±23 | 13.8 | ±0.8 |
| 6e (2.3 mg/mL) | H | 3-I PhO | 203 | 808 | ±57 | 12.1 | ±1 |
| 6e (1 mg/mL) | H | 3-I PhO | 203 | 568 | ±87 | 17.5 | ±2 |
| 6f | H | 4-I PhO | 212 | 340 | ±22 | 14 | ±1 |
| 6g (2.3 mg/mL) | I | PhO | 800 | 122 | ±14 | 3.5 | ±0.3 |
| 6g (1 mg/mL) | I | PhO | 1150 | 182 | ±23 | 4.8 | ±0.5 |

As shown in Table 2, the threshold values ($I_{th}$) spanned an order of magnitude with the nitro derivative 2d showing a threshold energy of 75 MW/cm² while the halophenoxy substituted sub-Pcs were found to have much higher values, ranging from 340-930 MW/cm². Molar extinction coefficients found in the Z-scan experiments are approximately the same as those found through UV-Vis measurements (Table 1). Some variation was expected between the two methods.

Figure 11:
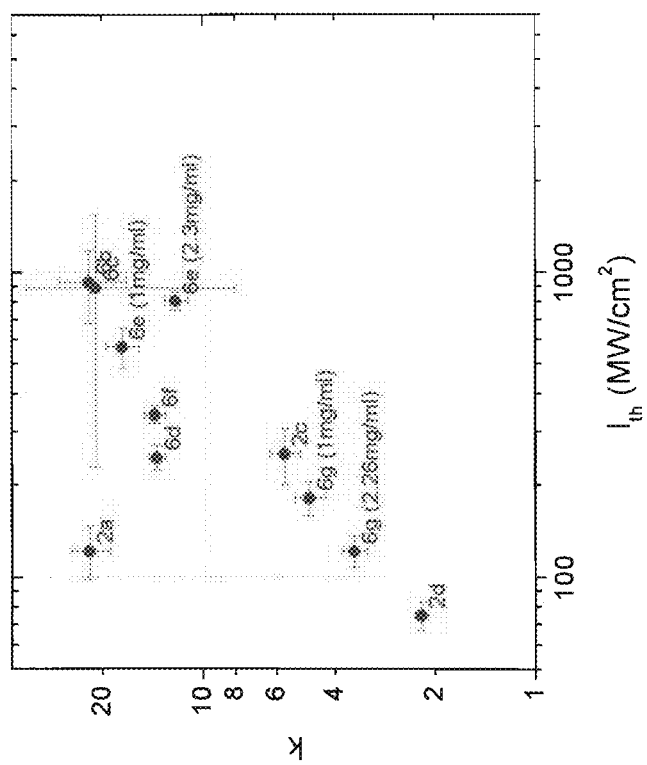
FIG. 11 is a graphical depiction of k values versus the intensity threshold ($I_{th}$) of subphthalocyanines RSAs according to some embodiments.

FIG. 11 shows the dependence of k values vs. intensity threshold for all dyes from Table 2. All dyes examined showed RSA properties. But, FIG. 11 shows that dyes with low k values also have low threshold intensities and dyes with high k values have larger threshold intensities. Blue RSAs having a large k value and a low threshold intensity would allow μ-holograms to be written with low intensity lasers and may be utilized in embodiments of optical data storage media intended for such applications.

Figure 12:
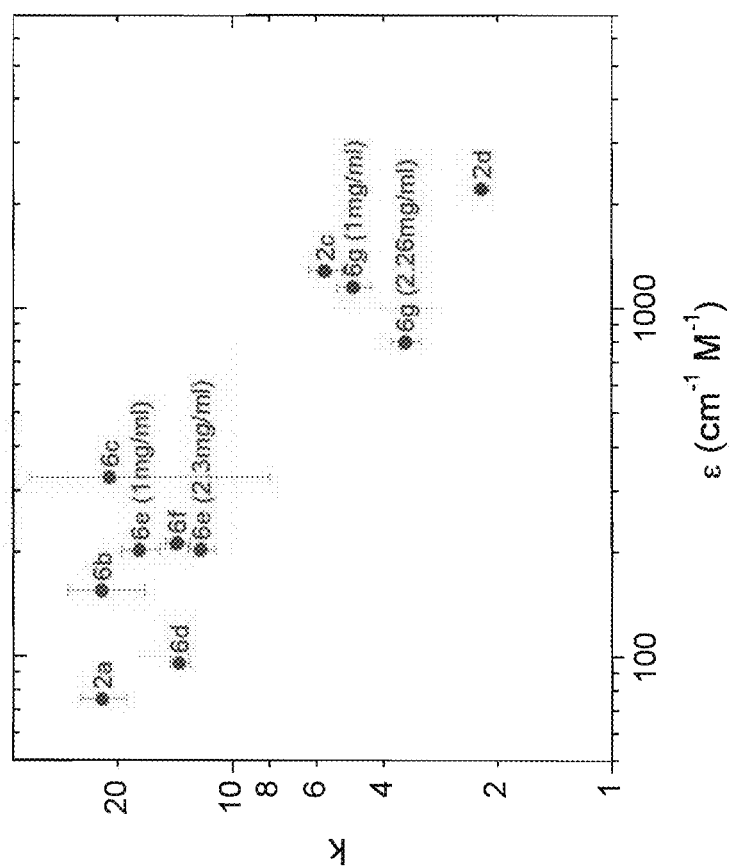
FIG. 12 is a graphical depiction of k values versus the linear extinction coefficient ($\epsilon$) of subphthalocyanines RSAs according to some embodiments.

Another representation of the data shown is shown FIG. 12, and indicates a correlation between the k values and the linear extinction coefficient at 405 nm. Clearly, materials having lower linear absorption also show stronger nonlinear absorption enhancement at higher intensities.

Figure 13:
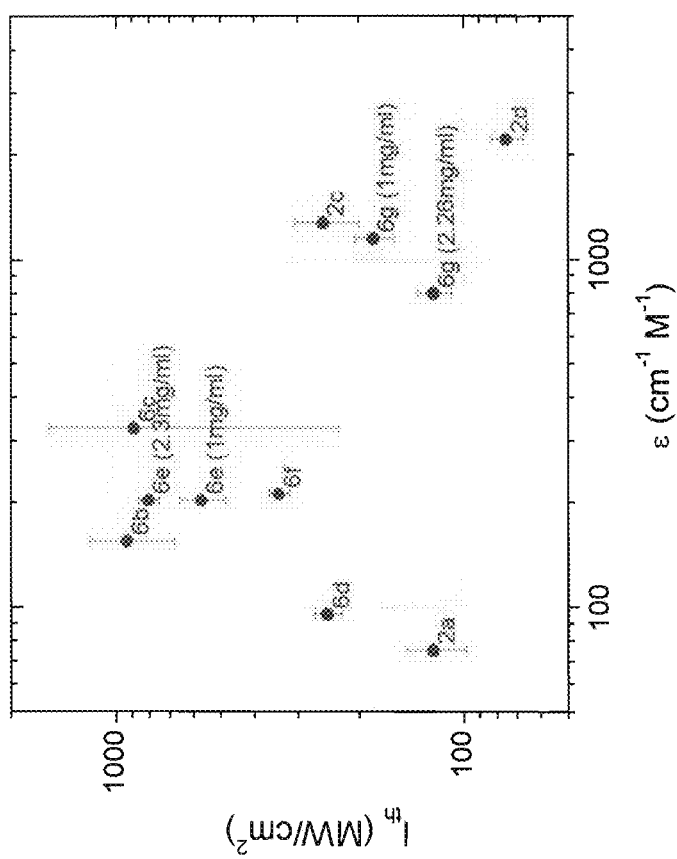
FIG. 13 is a graphical depiction of the intensity threshold ($I_{th}$) versus the linear extinction coefficient ($\epsilon$) of subphthalocyanines RSAs according to some embodiments.

A final representation of the data is shown in FIG. 13 (Threshold Intensity vs Extinction Coefficient). With the exception of the parent sub-Pc (2a) and the 3,5-dibromo derivative (6d), the materials with the lowest threshold intensities also had the higher extinction coefficients.

Taken together, Examples 1-2 and the data obtained therefrom show that many of the variety of subphthalocyanine dyes (Sub-Pcs) synthesized are capable of performing as blue RSA dyes as determined by Z-scan measurements. As such, these materials may be utilized in either energy transfer or phase change approaches to n-hologram recording.

Examples 3-5

Microhologram Recording

Sample Preparation
Thin film samples for demonstrating microholograms and recording the reflectivity after writing microholograms were prepared as follows:

Example 3

Subphthalocyanine/Stilbene/PMMA

Solution of PMMA (0.870 g) with trans-stilbene (80 mg), 1.3 wt % of 3IPhOSubPc (3-iodophenoxysubphthalocyaninato]boron(III)) will be prepared using dichloroethane/methylene chloride solvent mixture (15 g, 2:8 v/v) as solvent. The solution will be filtered using 0.45 nm filter, poured onto a glass rim (5 cm diameter) on a glass plate setup and dried on a hot plate maintained at about 45° C. for 5 hours and at about 75° C. overnight. After drying on a hot plate, the films will be removed from the glass plates and vacuum dried at 60° C. for 6 hours.

Example 4

Subphtalocyanine/Polyvinylcinnamate (PVCm)

1 g of PVCm containing 68 wt % cinnamate (MW 100,000) was dissolved in 1:1 dichloroethane/methylene chloride. 1.3 wt % of diBrSubPc (3,5-dibromophenoxysubphthalocyaninato]boron(III)) was added and the materials dissolved by stirrer accompanied by heating on a hot plate maintained at 70° C. The solution was then filtered using a 0.450 mm syringe filter and the filtered solution poured into a glass rim (5 cm diameter) on a glass plate setup and dried on a hot plate maintained at 45° C. for 12 hours and at 75° C. overnight. After drying on a hot plate, the films were removed from the glass plates and dried in vacuum at 70° C. for 6 hours.

Example 5

Subphtalocyanine/Polyvinylcinnamate (PVCm)

1 g of PVCm containing 68 wt % cinnamate (MW 100,000) was dissolved in 1:1 dichloroethane/methylene chloride. 1.3 wt % of 3IPhOSubPc (3-iodophenoxysubphthalocyaninato] boron(III)) was added and the materials dissolved by stirrer accompanied by heating on a hot plate maintained at 70° C. The solution was then filtered using a 0.450 mm syringe filter and the filtered solution poured into a glass rim (5 cm diameter) on a glass plate setup and dried on a hot plate maintained at 45° C. for 12 hours and at 75° C. overnight. After drying on a hot plate, the films were removed from the glass plates and dried in vacuum at 70° C. for 6 hours.

Microhologram Recording
A tunable optical parametric oscillator system operating at the 405 nm wavelength was used as a pulsed light source for recording and readout of micro-holograms. The light was focused into the medium sample using optics with numerical aperture (NA) of 0.16, resulting in the approximate dimensions of the recording volume to be 1.6×1.6×17 μm. The pulse energies used for micro-hologram recording was between 10s to 100s of nano-Joules, which allowed one to achieve light intensity values of hundreds of MW/cm² to several GW/cm² at the focal spot of such focused recording beam. The readout of the light reflected from micro-holograms was done using the same beam attenuated by approximately 100-1000× with respect to the recording power.

The recording of μ-holograms in the optical data storage media was performed by two high-intensity counter-propagating pulsed recording beams focused and overlapped in the bulk of the recording medium to produce the intensity fringe pattern consisting of light and dark regions (fringes). The illuminated regions of the interference pattern undergo a change as described above, which results in a locally modified refractive index of the material, while the dark regions remain intact, thus creating a volume hologram. The present threshold optical data storage media is sensitive to a high-intensity light and is relatively inert to the low-intensity radiation. The power of the recording beam was adjusted so that the light intensity near the focal region of the beam is above the recording threshold (above which the change readily occurs), while remaining low outside the recordable region away from the focal spot of the beam, thus eliminating unintended media modification (recording or erasure).

During μ-hologram recording, the primary recording beam was split into the signal and the reference using a half-wave plate (λ/2) and a first polarization beam splitter. The two secondary beams were steered to the sample in a counter-propagating geometry and were focused to overlap in the bulk of the optical data storage media by identical aspheric lenses with a numerical aperture (NA) of up to 0.4. The polarization of both beams is converted into circular polarization—with two quarter-wave plates (λ/4) to ensure that the beams interfere to create a high-contrast fringe pattern. The sample and the signal beam lens were mounted on closed-loop three-axis positioning stages with 25 nm resolution. A position-sensitive detector on the reference side of the sample was used to align the signal lens for optimized overlap of the focused signal and reference beams in the medium, and thus, optimized recording.

A variable attenuator and the half-wave plate/PBS assembly were used to control the power level during recording and/or read-out. This allows the μ-holographic recording characteristics of the optical data storage media to be measured as a function of the recording power and/or energy. This functional dependence distinguishes between a linear optical data storage medium/recording, where the strength of the recorded hologram is largely defined by the total amount of light energy received by the medium, but is independent of the light intensity, and a nonlinear, threshold optical data storage medium/recording, where the recording efficiency is highly dependent upon the intensity of the light. In a linear medium, a small exposure results in a low-strength hologram, which gradually grows with higher exposures. In contrast, in a nonlinear, threshold medium, recording is only possible with intensity exceeding the threshold value.

During read-out, the signal beam was blocked, and the reference beam was reflected by the μ-holograms in the direction opposite to the incident direction. The reflected beam was coupled out from the incident beam path using the quarter-wave plate and a second polarizing beam splitter, and was collected on a calibrated photodiode in a confocal geometry to provide an absolute measure of the diffraction efficiency. By translating the sample with respect to the readout optics, it is possible to obtain a 3D profile of a micro-hologram diffraction response and evaluate dimensions of a micro-hologram.

Figure 14:
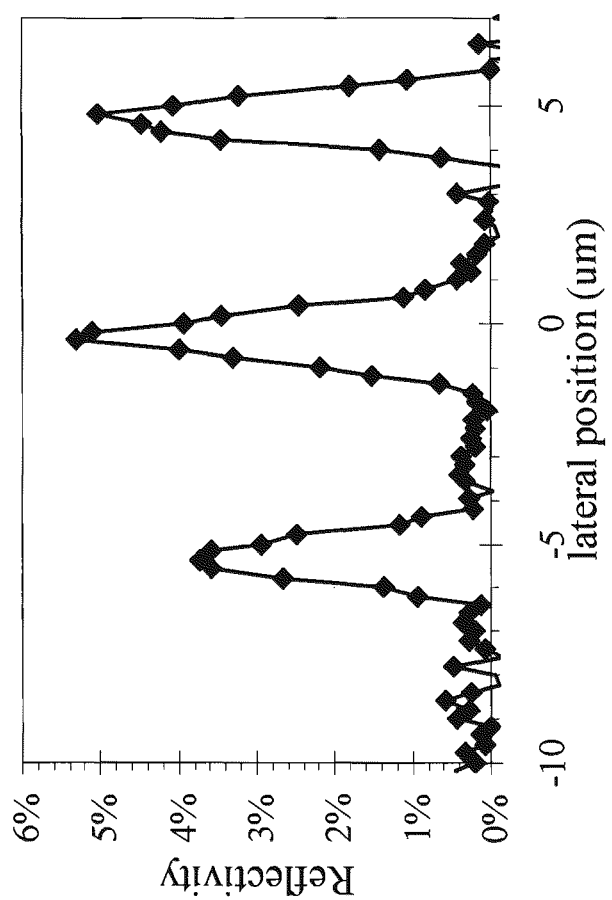
FIG. 14 is a graphical depiction of the reflectivity of an array of micro-holograms recorded in one embodiment of the optical data storage media.
Figure 15:
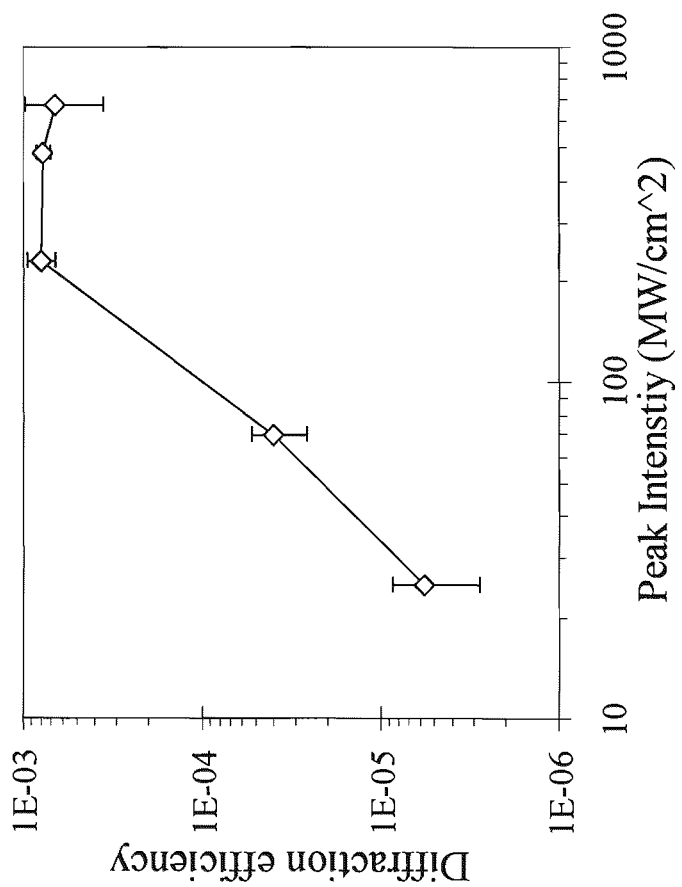
FIG. 15 is a graphical depiction of the diffraction efficiency of one embodiment of the optical data storage medium as a function of intensity for a fixed recording fluence of 60 J/cm$^2$.

FIG. 14 shows an experimentally measured reflectivity of a series of μ-holograms vs. lateral position of the sample with respect to the readout beam for the optical data storage media prepared according to Example 4. The peaks occur at the positions of the sample when the reference beam is centered on one of the micro-holograms in the array. FIG. 15 shows a dependence of the micro-hologram reflectivity recorded with the same fluence but varied intensity in the optical data storage medium prepared according to Example 5, demonstrating the threshold functionality of the material: material recording sensitivity dramatically increases when the intensity exceeds the threshold value (~100 . . . 200 MW/cm$^2$), while for the sub-threshold intensities, the recorded hologram reflectivity is essentially zero (within the detection limit of the system).

The diffraction efficiency for Example 3 is expected to be from about 0.03% to about 0.26%, depending on the recording fluence. Example 4 had a measured diffraction efficiency of 7.74%; while example 5 had a measured diffraction efficiency of 1.55%.

While only certain features of the invention have been illustrated and described herein, many modifications and changes will occur to those skilled in the art. It is, therefore, to be understood that the appended claims are intended to cover all such modifications and changes as fall within the true spirit of the invention.

The invention claimed is:
1. A method, comprising:
(a) providing an optical data storage medium comprising:
   a polymer matrix;
   a reactant capable of undergoing a photochemical change upon triplet excitation; and
   a non-linear sensitizer comprising one or more subphthalocyanine reverse saturable absorbers capable of absorbing incident radiation at 405 nm to cause upper triplet energy transfer to said reactant; and
(b) recording bit-wise a microhologram in said optical data storage medium by irradiating the optical data storage medium with an exposure consisting of an interference pattern having an incident radiation of about 405 nm wavelength, to cause upper triplet energy transfer from the non-linear sensitizer to the reactant, thereby causing the refractive index change,
wherein the one or more subphthalocyanine reverse saturable absorbers comprise boron (III) subphthalocyanines.

2. The method of claim 1, wherein the one or more subphthalocyanine reverse saturable absorbers comprise chloro[2,9,16-tribromosubphthalocyaninato]boron(III), chloro[2,9,16-triiodosubphthalocyaninato]boron(III), chloro[trinitrosubphthalocyaninato]boron(III), chloro[2,9,16-tri-tert-butylcyaninato]boron(III), chloro[2,9,17-tri-tert-butylsubphthalocyaninato]boron(III), phenoxy[subphthalocyaninato]boron(III), 3-bromophenoxy[subphthalocyaninato]boron(III), 4-bromophenoxy[subphthalocyaninato]boron(III), 3,5-dibromophenoxysubphthalocyaninato]boron(III), 3-iodophenoxysubphthalocyaninato]boron(III), phenoxy[2,9,16-triiodosubphthalocyaninato]boron(III), 3-iodophenoxy[2,9,16-triiodosubphthalocyaninato]boron(III), 4-iodophenoxy[2,9,16-triiodosubphthalocyaninato]boron(III), or combinations of these.

3. The method of claim 1, wherein the one or more subphthalocyanine reverse saturable absorbers comprises [3-iodophenoxysubphthalocyaninato]boron(III)].

4. The method of claim 1, wherein the reactant comprises a stilbene derivative, a cinnamate derivative, a cinnamamide derivative, or combinations of these.

5. The method of claim 4, wherein the reactant comprises a stilbene derivative.

6. The method of claim 1, wherein the optical data storage medium further comprises a mediator capable of transferring energy between the non-linear sensitizer and the reactant.

7. The method of claim 6, wherein the mediator comprises acetophenone, dimethylphthalate, benzophenone, 9H-fluorene, biphenyl, phenanthrene, 1-napthonitrile, or combinations of these.

8. The method of claim 1, wherein the reactant comprises a cinnamate, a cinnamate derivative, a cinnamamide derivative, or combinations of these.

9. The method of claim 8, wherein the reactant comprises polyvinyl cinnamate (PVCm), polyvinyl 4-chlorocinnamate (PVClCm), polyvinyl 4-methoxycinnamate (PVMeOCm), (2E,2'E)-((1S,2S)-cyclohexane-1,2-diyl)bis(3-phenylacrylate), (2E,2'E)-(1S,2S)-cyclohexane-1,2-diyl)bis(4-chlorophenylacrylate), (2E,2'E)-(1S,2S)-cyclohexane-1,2-diyl) bis(4-methoxyphenyl)acrylate), (2E,2'E)-N,N'-((1S,2S)-cyclohexane-1,2-diyl)bis(3-phenyl)acrylamide (2E,2'E)-N,N'-((1S,2S)-cyclohexane-1,2-diyl)bis(3-(4-chlorophenyl)

acrylamide), (2E,2'E)-N,N'-((1S,2S)-cyclohexane-1,2-diyl)bis(3-(4-methoxyphenyl)acrylamide, or combinations of these.

10. The method of claim 1, wherein the polymer matrix comprises poly(alkyl methacrylates), poly(alkyl acrylates), polystyrenes, polycarbonates, poly acrylates, poly(vinylidene chloride), poly(vinyl acetate), or combinations thereof.

11. The method of claim 1, wherein the reactant and the non-linear sensitizer are distributed substantially homogenously throughout the polymer matrix.

* * * * *